United States Patent [19]

Blagaila

[11] Patent Number: 5,349,350
[45] Date of Patent: Sep. 20, 1994

[54] RUN LENGTH LIMITED ENCODING/DECODING SYSTEM FOR LOW POWER DISK DRIVES

[75] Inventor: John H. Blagaila, Boulder, Colo.

[73] Assignee: Integral Peripherals, Inc., Boulder, Colo.

[21] Appl. No.: 786,334

[22] Filed: Oct. 31, 1991

[51] Int. Cl.⁵ .......................... H03M 7/46; H03M 7/20
[52] U.S. Cl. ......................................... 341/59; 341/57; 341/100; 341/101
[58] Field of Search ......................... 341/59, 50, 51–56, 341/57, 100, 101, 58

[56] References Cited

U.S. PATENT DOCUMENTS

| | | |
|---|---|---|
| 4,337,458 | 6/1982 | Cohn et al. |
| 4,413,251 | 11/1983 | Adler et al. |
| 4,488,142 | 12/1984 | Franaszek |
| 4,503,420 | 3/1985 | Rub et al. |
| 4,571,575 | 2/1986 | McCullough ......................... 341/59 |
| 4,675,652 | 6/1987 | Machado ............................. 341/59 |
| 4,760,378 | 7/1988 | Iketani et al. ........................ 341/59 |
| 4,851,837 | 7/1989 | Baldwin .............................. 341/55 |
| 4,985,700 | 1/1991 | Mikami ............................... 341/59 |
| 5,173,694 | 12/1992 | Lynch, Jr. et al. .................. 341/59 |

OTHER PUBLICATIONS

P. A. Franaszek, "Sequence-State Methods for Run-Length-Limit Coding" *IBM J. Res. Develop*, vol. 14, pp. 376–383, Jul. 1970.

T. Horiguchi and K. Morita, "An Optimization of Modulation Codes in Digital Recording" *IEEE Trans. Magn.*, vol. MAG-12, p. 740–742, Nov., 1976.

*Primary Examiner*—Sharon D. Logan
*Attorney, Agent, or Firm*—Skjerven, Morrill, MacPherson, Franklin & Friel

[57] ABSTRACT

The run length limited encoding/decoding system of this invention includes a clock swap logic circuit, a read reference clock multiplexer circuit, a write clock skip logic circuit, an encoder start logic circuit, an encoder circuit, a read clock skip logic circuit, a decoder start logic circuit, a decoder circuit, an input data buffer and a three-state output data buffer. The encoder circuit includes a deserializer for receiving serial data from a disk controller and blocking the data into m bit words. Each m bit data word is supplied directly to an encoding combinatorial logic circuit which in turn generates an n bit code word. The n bit code word is loaded in a serializer and serially transmitted out of the serializer. The decoder circuit includes a deserializer/serializer and a decoding combinatorial logic circuit. The deserializer/serializer receives a serial stream of encoded data and converts the data into n bit code words. Each n bit code word is loaded directly into the decoding combinatorial logic circuit which in turn generates an m bit data word. The m bit data word is loaded into the deserializer/serializer so that as the next n bit code word is serially loaded in the deserializer/serializer, the m bit data worded is serially moved out of the deserializer/serializer.

34 Claims, 20 Drawing Sheets

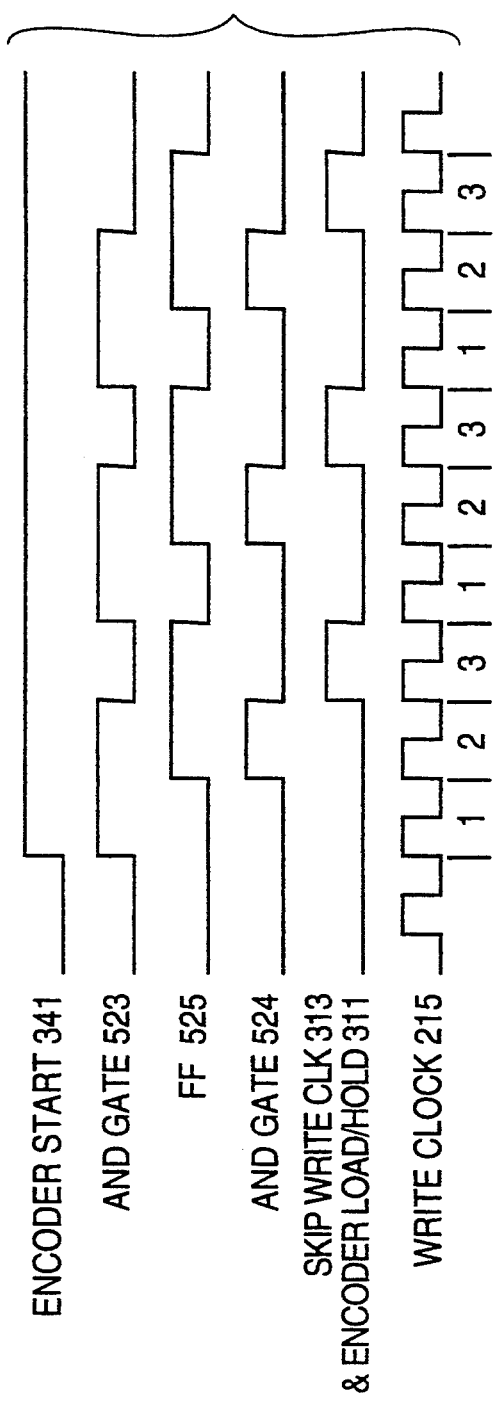

RUN LENGTH LIMITED ENCODING/DECODING SYSTEM FOR LOW POWER DISK DRIVES

BACKGROUND OF THE INVENTION

1. Field of the Invention

This invention relates generally to encoding and decoding digital data and more particularly, to the encoding and decoding of digital data in low power disk drives.

2. Background Information

Digital information stored on a disk drive is typically encoded before the information is written onto the disk. The encoding increases the effective storage density of the disk drive and enables reliable demodulation of the read-back signal. One type of encoding used in storing digital information on a disk drive is called run length limited (RLL) encoding. Typically, RLL codes encode the data so that any two consecutive "ones" in the encoded binary sequence are separated by at least d zeros but no more than k zeroes. The constant d is used to control pulses crowding effects while the constant k is used to provide a self-clocking ability in the read-back of the encoded data. Further, the data is typically blocked into words of length m. Each m bit word is encoded in n bits. The ratio m/n is referred to as the code rate.

In one variation of run length limited encoding, the code rate is $\frac{2}{3}$ so that each two consecutive data bits are mapped into three consecutive code bits, which in turn are recorded on the disk. When the data is retrieved from the disk, the serial data stream is converted to three bit code words that are decoded to recreate the original two data bits. Such conventional run length limited ratio $\frac{2}{3}$ encoding/decoding systems typically are clocked by a multiplicity of clocks derived from a base clock rate. The base clock rate is the clock frequency used for other components in the disk drive electronics.

Data is clocked from the disk controller to the encoding/decoding system by a data bit clock. The base clock rate is typically divided by three to obtain the data bit clock rate. The encoded data word generated by the encoding/decoding system is clocked by a write clock to the disk. The base clock rate is divided by 2 to obtain the write clock rate.

A prior art example of one data encoding/decoding system is presented in U.S. Pat. No. 4,337,458 entitled "Data Encoding Method and System Employing Two-Thirds Code Rate with Full Word Look-Ahead" issued to Cohn et al. on Jun. 29, 1982. FIG. 1A is a block diagram of encoder 100 of Cohn et al. and FIG. 1B is a block diagram decoder 150 of Cohn et al. Signal CLK (FIGS. 1A and 1B) represents the base clock rate. In encoder 100, base clock rate CLK is divided by 2 to obtain the write clock rate which shifts out the code word from shift register 48. Base clock rate CLK is divided to 3 to obtain the data bit clock rate which shifts data bits into shift register 14. Base clock rate CLK is divided by 6 to obtain the code word clock rate which loads register 22.

Notice that Cohn requires a first shift register 14 to block the serial data into two-bit data words. A second circuit 22 to generate an address that is applied to read-only memory (ROM) 38. ROM 38 based upon the input address encodes the two-bit data word to a three-bit code word and a flag bit $F_2$. A third shift register 86 is used to serially write the code word to the disk.

Decoder 150 is even more complex. Decoder 150 includes a second ROM and four other circuits 62, 72, 84 and 86. The complexity of this encoding/decoding system and the number of circuits limits its application in miniature low power disk drives because the size of the system requires valuable real estate that cannot be used for other disk drive functions. Further, the complex circuit introduces signal propagation time delays and the related timing jitter.

Electronic circuits in disk drives that utilize encoding/decoding schemes, such as those of Cohn et al. are also disadvantageous because the high base clock rate CLK results in considerable power consumption. Specifically, circuitry which switches more frequently generally consumes more power than does circuitry which switches less frequently. Accordingly, the above described encoding/decoding scheme of the prior art is disadvantageous since it is based on the high frequency of the base clock.

In addition to the power consumption of electronic circuits clocked by a high frequency clock, the frequency of the base clock renders using some data synchronizer and synthesizer chips difficult. Data synchronizer and synthesizers such as the National DP8491, for example, do not have a clock frequency that is three times the data bit clock rate. Rather, the supplied clock clocks at the write clock rate. Accordingly, using the prior art encoding/decoding system requires a dividing the supplied clock rate by 1.5 to generate the required data bit rate clock. Divide by 1.5 circuits typically use both edges of the incoming clock signal. Thus, the supplied clock must have very good clock symmetry. Furthermore, even if the supplied rate clock has a good initial symmetry, this symmetry degrades as the signal passes through a few levels of gating because the high to low and low to high propagation delays through gates and flip-flops differ. Consequently, the prior art encoding/decoding system is effectively limited to systems that have a base clock frequency that is three times the required data bit clock rate.

SUMMARY OF THE INVENTION

A novel run length limited encoding/decoding system that minimizes propagation delays and the associated timing jitter problems includes a deserializer means, operatively coupled to a serial data stream from a disk drive controller, for blocking the serial data steam into m bit data words. Each m bit data word is supplied to an encoding means over a plurality of parallel output terminals. The encoding means, in response to the m bit data word, generates an n bit code word.

Since the encoding means receives the m bit code word directly from the deserializer, there are no propagation delays associated with generating additional information for use in the encoding process such as an address for a read-only memory. The n bit code word is passed directly to a serializer means from the parallel output terminals of the encoding means. The serializer converts the n bit code word to a serial data stream that is, in this embodiment, written to a disk.

The encoding/decoding system of this invention also includes a deserializer/serializer means, operatively coupled to a serial data stream of encoded data, for blocking the encoded serial data steam into n bit code words, and for generating a serial data stream from m bit data words. The deserializer/serializer provides said n bit code word via parallel output terminals to a decoding means. The decoding means converts the n bit code word into a m bit data word that is loaded in parallel into the deserializer/serializer. As the next n bits are shifted into the deserializer/serializer, the m bit data word is shifted out of the deserializer/serializer.

BRIEF DESCRIPTION OF THE DRAWINGS

FIG. 5B is a timing diagram for the write clock skip logic circuit of this invention.

DETAILED DESCRIPTION

Figure 1A:
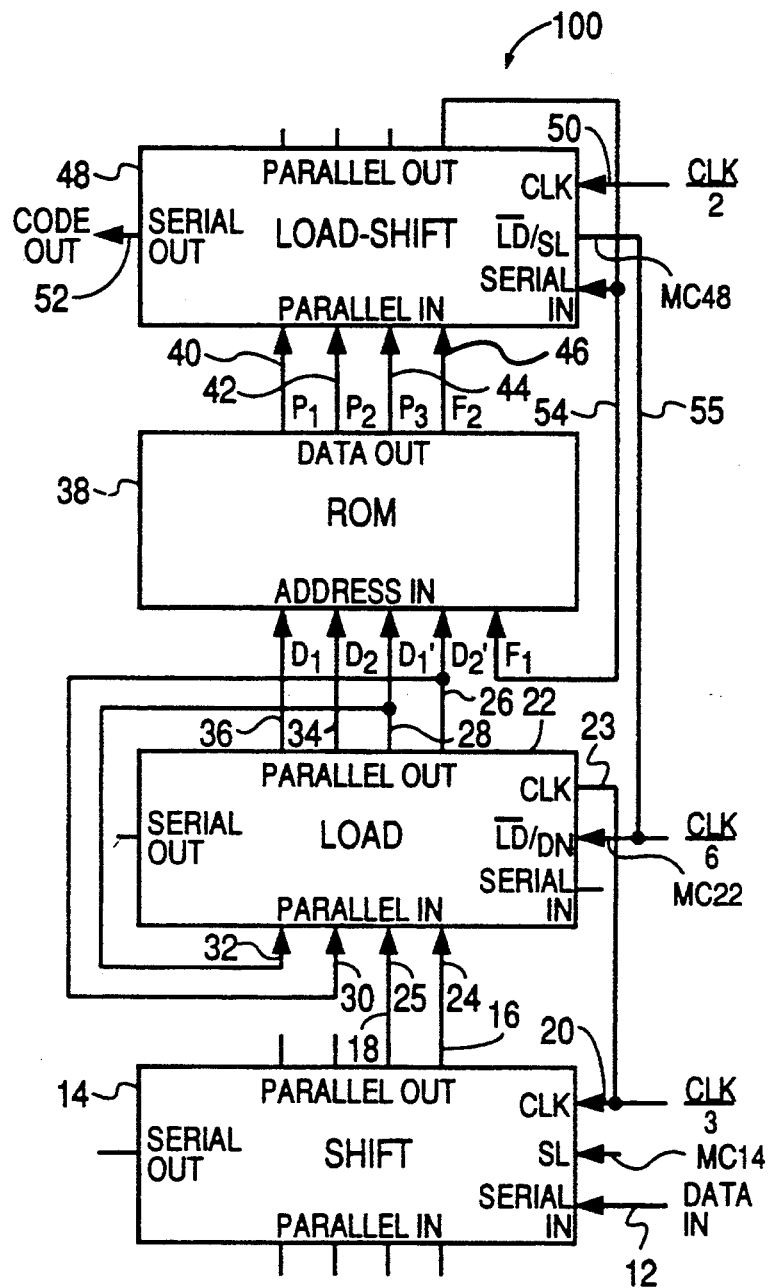
FIGS. 1A and 1B are a block diagram of a prior art run length limited encoder and a prior art run length limited decoder respectively.
Figure 1B:
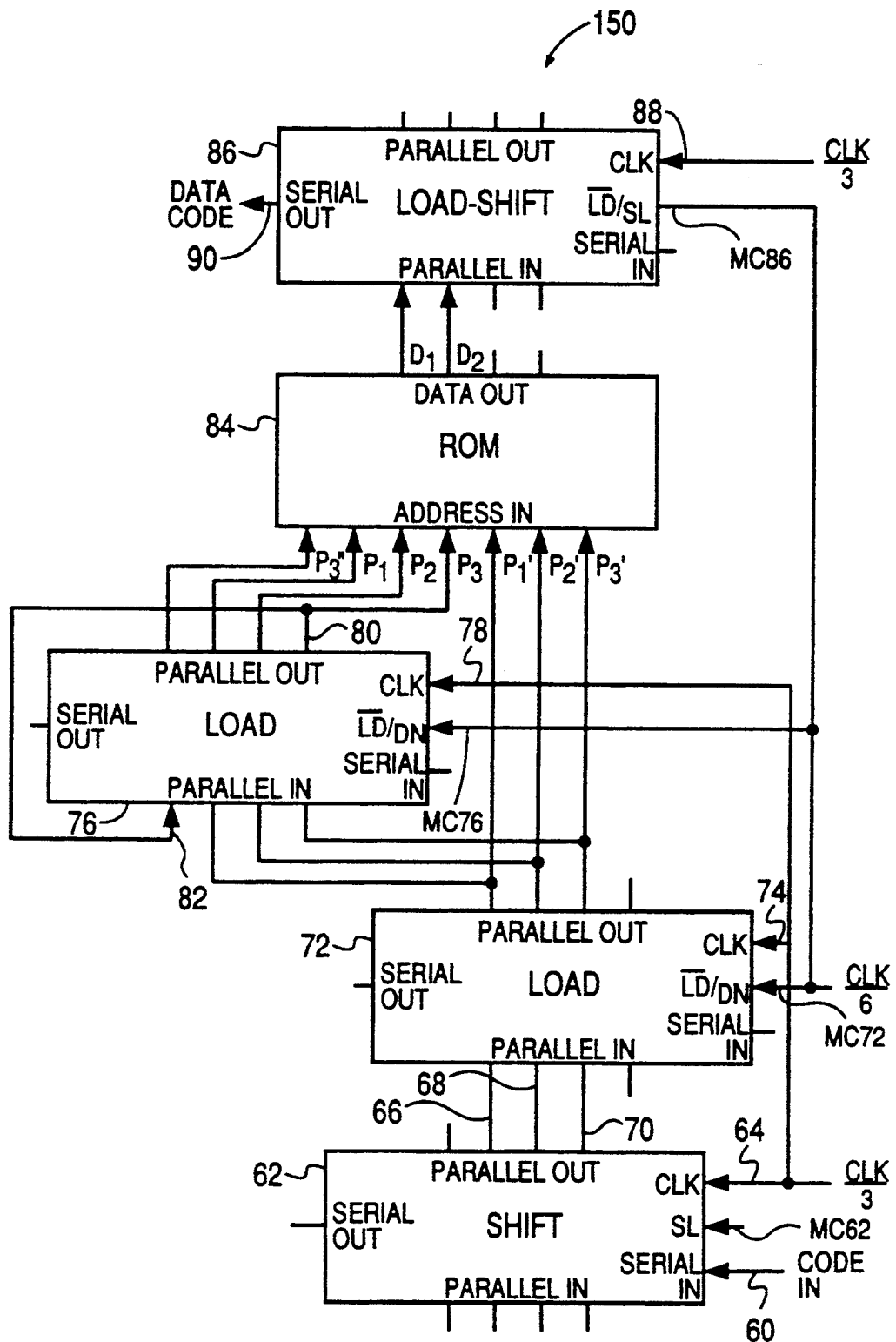
Figure 2:
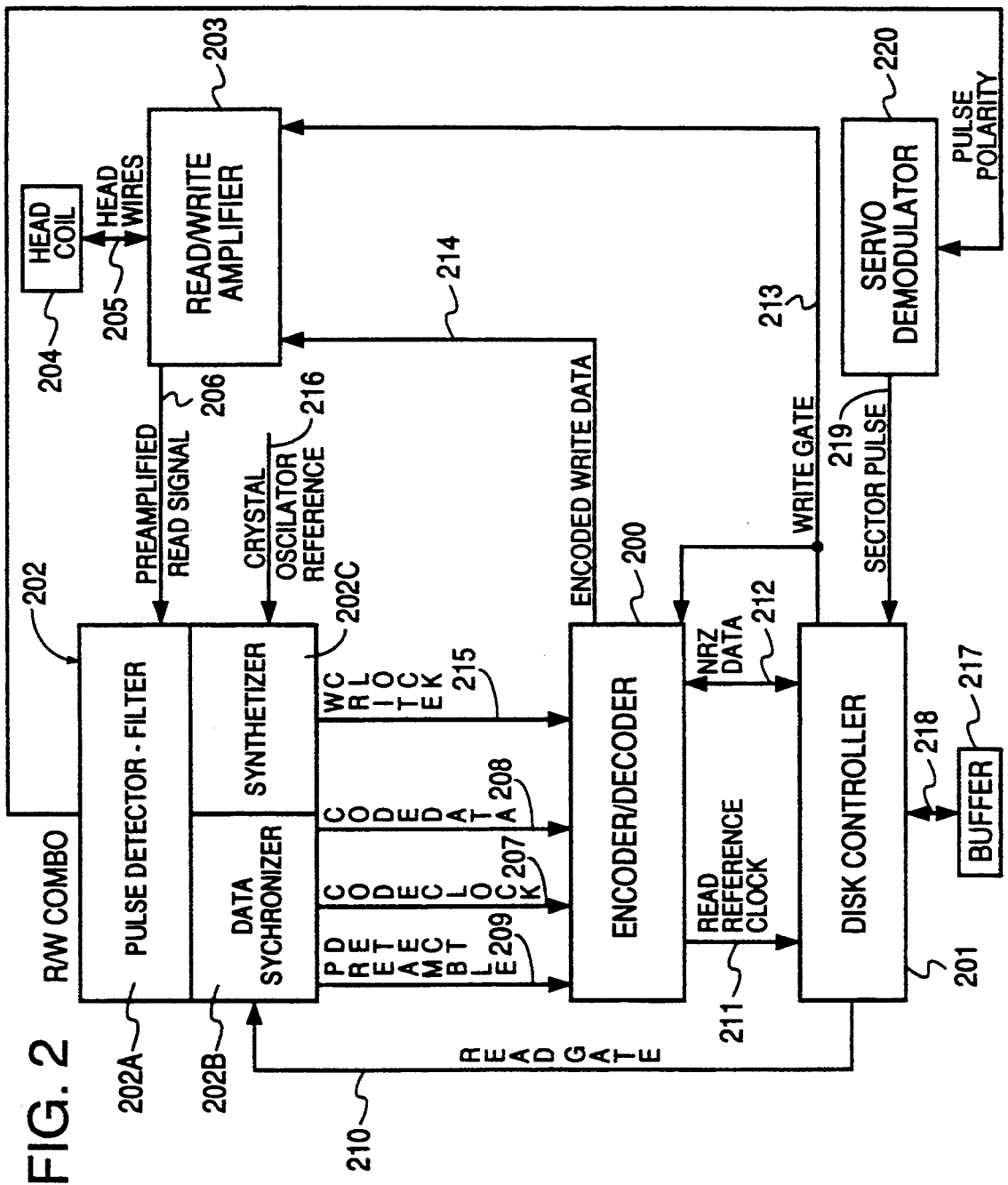
FIG. 2 is a block diagram of the encoding/decoding system of the present invention and the associated disk drive components.

A block diagram of one configuration of miniature low power disk drive electronic circuitry for (i) encoding binary data and writing the encoded data to a disk and (ii) reading encoded data from a disk and decoding the encoded data using a novel encoding/decoding system 200 of the present invention is illustrated in FIG. 2. In a preferred embodiment, 1, 7 run length limited coding is utilized with a ⅔ code rate.

Disk controller 201 receives data to be written on a disk from a computer data bus through a host interface circuit and stores the data in buffer memory 217. Buffer memory 217 may be, for example, a 1k byte or a 256k byte dual port memory. Subsequently, disk controller 201 serially transfers the data from buffer memory 217 over NRZ data line 212 to encoding/decoding system 200 of this invention. The data is serially synchronously clocked over NRZ data line 212 by the clock signal on read reference clock line 211. The operations of disk controller 201 are well known to those skilled in the art. One disk controller suitable for use with encoding/decoding system 200 is available from Cirrus Logic of Fremont, Calif. under part no. SH360.

A write from buffer memory 217 to the disk is initiated by disk controller 201 after servo demodulator circuit 220 sends a sector pulse over sector pulse line 219 to disk controller 201. The sector pulse is derived from precise prerecorded timing signals on the disk. A predetermined time after disk controller 201 receives the sector pulse, disk controller 201 asserts the write gate on write gate line 213 to encoding/decoding system 200 and to read/write amplifier 203. Upon assertion of the write gate, encoding/decoding system 200 swaps the clock signal on read reference clock line 211 from the signal on code clock line 207 to the signal on write clock line 215.

Disk controller 201 next starts to transmit a predetermined sequence of data to encoding/decoding circuit 200 over NRZ line 212. This predetermined sequence of data is initially clocked at the write clock rate. In prior art systems, the clock rate on read reference clock line 211 was the data bit clock rate F which is slower that the write clock rate, which in this embodiment is 1.5F. Consequently, the initial operations in the write to the disk are at a higher clock speed which in turn enhances the performance of disk controller 201 by reducing the lengths of the overhead fields (for example, the read-to-write gap) required by controller 201.

As explained more completely below, assertion of the write gate results in release of a deserializer in encoding/decoding system 200 that blocks the serial data stream on NRZ line 212 into two bit data words, and switches the clock rate on read reference clock line 211 from the code clock rate to the write clock rate. The predetermined sequence of data transmitted to encoding/decoding system 200 by disk controller 201 enables the encoding process.

To maintain the correct timing sequence for reading data into encoding/decoding system 200 and writing coded data to the disk, disk write clock skip logic generates a signal that is used to blank (n-m) clock cycles of the disk write clock signal after every m clock cycles, where m is the number of bits in a data word and n is the number of bits in a code word, to thereby generate the data bit clock rate on read reference clock line 211. The clock swap logic and the write clock skip logic are both described more completely below. In this embodiment, the write clock signal on write clock line 215 is generated by synthesizer 202C of read/write (R/W) combo integrated circuit 202 from a crystal oscillator reference signal 216. One R/W combo integrated circuit suitable for use with encoding/decoding system 200 is available from National Semiconductor of Santa Clara, Calif. as part number DPC 102VF.

When the encoder in encoding/decoding system 200 is enabled, the remaining data in the predetermined sequence of serial data from disk controller 201 is transferred to the deserializer by the clock rate on read reference line 211. The deserializer blocks the data into two bit data words that are each sequentially supplied to an encoding logic circuit that in turn generates a three bit code word that is loaded in a serializer. The three bit code word is serially transmitted from the serializer at the write clock rate over encoded write data line 214. This encoded predetermined sequence of data from disk controller 201 forms a data preamble of phase lock looped (PLL) data on the disk.

To terminate the encoded PLL data, disk controller 210 sends a sync word to encoding/decoding system 200 which is encoded and then disk controller 201 serially transfers the data from buffer memory 217 to encoding/decoding system 200. Consequently, a serial stream of encoded data is supplied to read/write amplifier 203 over encoded write data line 214.

Unlike prior art systems, that required a ROM for encoding the data, two shift registers, and a holding register to generate the two bit word for encoding by the ROM, the encoder of this invention in encoding/decoding system 200 uses only a deserializer, an encoding logic circuit, and a serializer to generate the encoded word. Consequently, the ROM is eliminated and the resulting smaller circuit is suitable for a low profile miniature disk drive, e.g., a 1.8 inch footprint disk drive. One 1.8 inch disk drive suitable for this invention is described more completely in copending and commonly assigned U.S. patent application Ser. No. 07/629,948 of Morehouse et al. filed on Dec. 19, 1990 and entitled "Miniature Hard Disk Drive For Portable Computers," which is incorporated herein by reference in its entirety.

In response to the encoded data stream on encoded write data line 214, read/write amplifier 203 outputs current to magnetic read/write head coil 204 via head wires 205. The current through head coil 204 changes direction every time a pulse occurs. This in turn causes alternating magnetization patterns to be recorded on the magnetic media on the disk as it passes under head coil 204.

In reading data from the disk, each sector typically contains two regions, an embedded servo region and a data region. The data region is started by the region containing the encoded phase locked loop data, followed by the encoded synchronization byte (herein after encoded data synch byte), and finally the encoded data. The information in the embedded servo region is not encoded.

The embedded servo data field contains patterns which provide the electronics controlling the read/write head with accurate position information as to where the read/write head is located, both radially and circumferentially, relative to the disk. A sector mark bit in the servo field is used to generate a sector pulse at a precise circumferential location.

The encoded PLL sequence, data sync byte and data are read back from the disk by head coil 204 which in turn outputs analog alternating current patterns indicative of the encoded data on the disk over head wires 205 to read/write amplifier 203. These analog alternating current patterns are amplified by read/write amplifier 203 and in turn the amplified signals are supplied to pulse detector and filter 202A of R/W combo integrated circuit 202 over preamplified read signal line 206.

Pulse detector and filter 202A filters the analog patterns and converts the filter patterns into a string of digital code data pulses. Data synchronizer 202B receives these digital code data pulses, senses the bit rate of the code data, and outputs this sensed bit rate as a code clock signal on line 207. Individual bits in the coded data on line 208 are transferred synchronous to the code clock signal on line 207. Since in this embodiment, R/W combo integrated circuit 202, as described above, is a stock part, the operations performed by integrated circuit 202 are well known to those skilled in the art.

The signal on code clock line 207 is used by encoding/decoding system 200 to decode the encoded data on code data line 208 into two bit data words. Encoding/decoding system 200 serially outputs the two bit data words to disk controller 201 via NRZ data line 212 synchronous with the signal on read reference clock line 211.

More specifically, as the embedded servo data are read, the data are provided to encoding/decoding system 200, but the encoding/decoding system 200 is held in reset since system 200 is idle at this time. The embedded servo data is also independently provided to the servo control electronics of the disk drive. When servo demodulator 220 (FIG. 2) detects the sector mark bit in the embedded servo data field, servo demodulator 220 sends a sector pulse on line 219 to disk controller 201.

Disk controller 201 generates a read gate signal on line 210 to data synchronizer 202B a predetermined period of time after receiving the sector pulse on line 219. When data synchronizer 202B of R/W combo integrated circuit 202 receives the read gate on line 210, data synchronizer 202B begins looking for a preamble sequence, 11 i.e., the PLL sequence in the encoded data.

When the preamble is detected by data synchronizer 202B, e.g., typically, four bytes of the encoded PLL data, a high preamble detect signal, i.e., active, is sent to encoding/decoding system 200 on line 209. (Herein, the reference numeral for the signal and the line carrying the signal are taken as the same reference numeral for clarity.) While preamble detect signal 209 was low, a deserializer/serializer in the decoder section of encoding/decoding system 200 was held in the clear mode. Hence, the high preamble detect signal (i) takes the deserializer/serializer out of the clear mode and (ii) functions as an enable signal for decoder start logic in encoding/decoding system 200. Hence, the encoded data is clocked into the deserializer/serializer that in turn blocks the serial data stream into three bit code words.

The encoded data in the deserializer/serializer is provided to decoder start logic. When the encoded PLL data is detected in the deserializer/serializer by the decoder start logic, the decoder start logic generates a decoder start signal that enables read clock skip logic and initiates the decoding process.

Specifically, to maintain the correct timing sequence for reading data into encoding/decoding system 200 from the disk and writing data to disk controller 201, read clock skip logic converts the code clock rate to the data bit clock rate by blanking predetermined code clock pulses. The decoder start logic and the code clock skip logic are both described more completely below. In this embodiment, the code clock rate on code clock line 207 is generated by data synchronizer 202B of R/W combo integrated circuit 202.

When the decoder in encoding/decoding system 200 is enabled, each three bit code word from the deserializer/serializer is decoded by a decoder combinatorial logic circuit and the two bit data word is loaded into the deserializer/serializer. The two bit data word in then serially transferred over NRZ line 212 to disk controller 201. Initially, disk controller 201 receives the PLL data and then the data sync byte. When disk controller 201 detects the data sync byte, the encoded data is being blocked and decoded correctly. Consequently, disk controller 201 starts to transfer the data received on line 212 to buffer memory 217.

Figure 3:
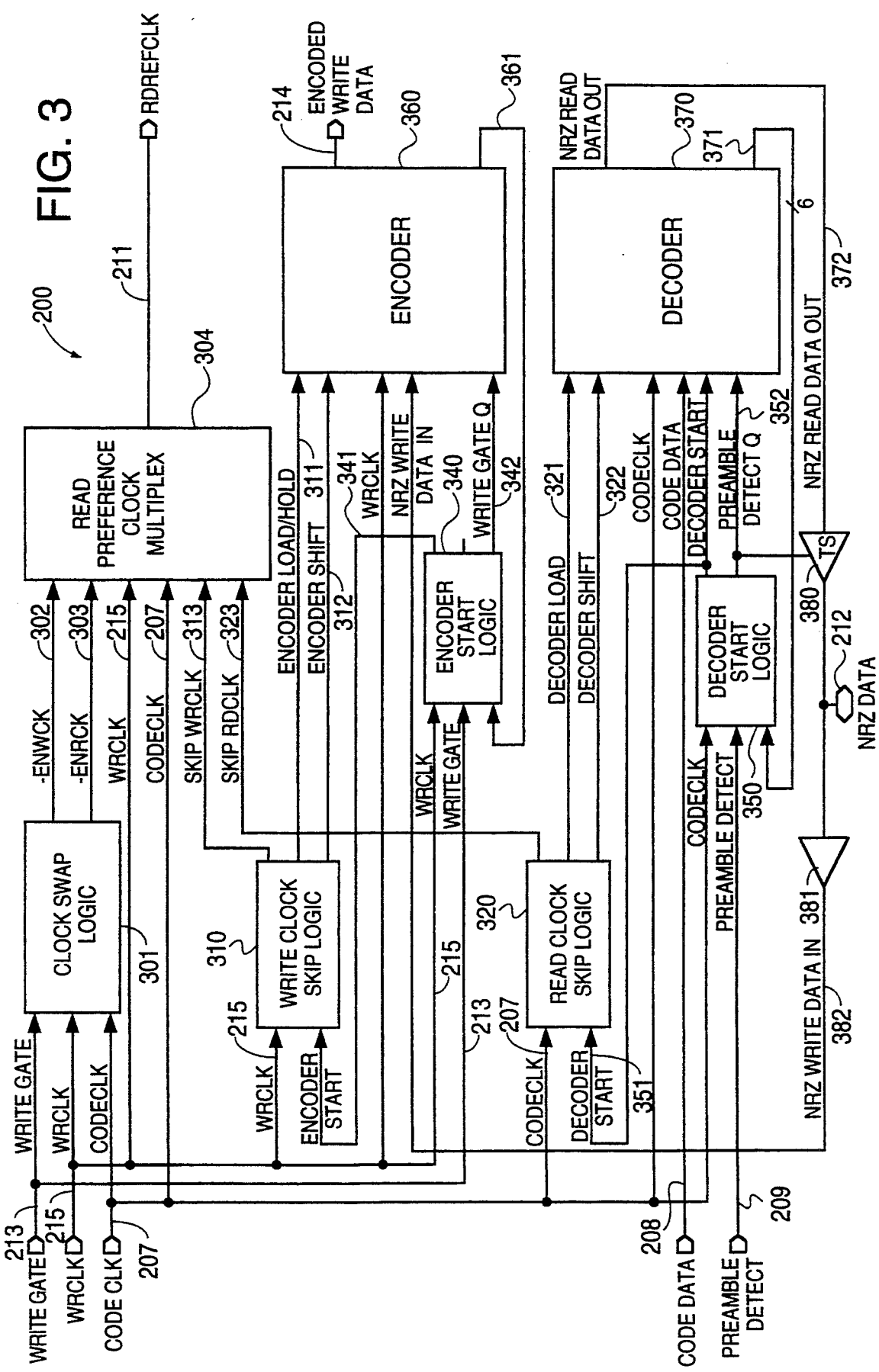
FIG. 3 is a more detailed block diagram of the encoding/decoding system of this invention.

FIG. 3 is a more detailed block diagram of encoding/decoding system 200 of this invention. In one embodiment, encoding/decoding system 200 is included in a single integrated circuit such as a gate array. However, in view of this disclosure, encoding/decoding system 200 may be may be integrated with some or all the functions of R/W combo integrated circuit 202 to constitute a single integrated circuit.

As described above and illustrated in FIG. 3, encoding/decoding system 200 includes a clock swap logic circuit 301, a read reference clock multiplexer circuit 304, a write clock skip logic circuit 310, an encoder start logic circuit 340, an encoder circuit 360, a read clock skip logic circuit 320, a decoder start logic circuit 350, a decoder circuit 370, an input data buffer 381 and a three-state output data buffer 380.

Clock swap logic circuit 301 (FIG. 3) receives write gate signal 213, write clock signal 215, and code clock signal 207. Clock swap logic circuit 301 generates two clock selection signals, enable write clock signal 302 and enable code clock signal 303. Read reference clock multiplexer 304 "swaps" the signal source driving read reference clock line 211 from write clock 215 to code clock 207 and conversely, based on which way the write gate changes. As described above, the signal on read reference clock 211 clocks serial data between encoding/decoding system 200 and disk controller 201 via serial NRZ data line 212.

When write gate 213 goes active (a low to high transition in this embodiment), clock swap logic circuit 301 first forces enable code clock signal 303 inactive, i.e., high, synchronous with code clock signal 207 and then drives enable write clock signal 302 low, i.e., active, synchronous with write clock signal 215. Similarly, when write gate 213 goes (a high to low transition) inactive after completion of a write operation, clock swap logic 301 first forces enable write clock signal 302 inactive synchronous with write clock signal 215 and then drives enable code clock signal 303 active synchronous with code clock signal 207.

Figure 4:
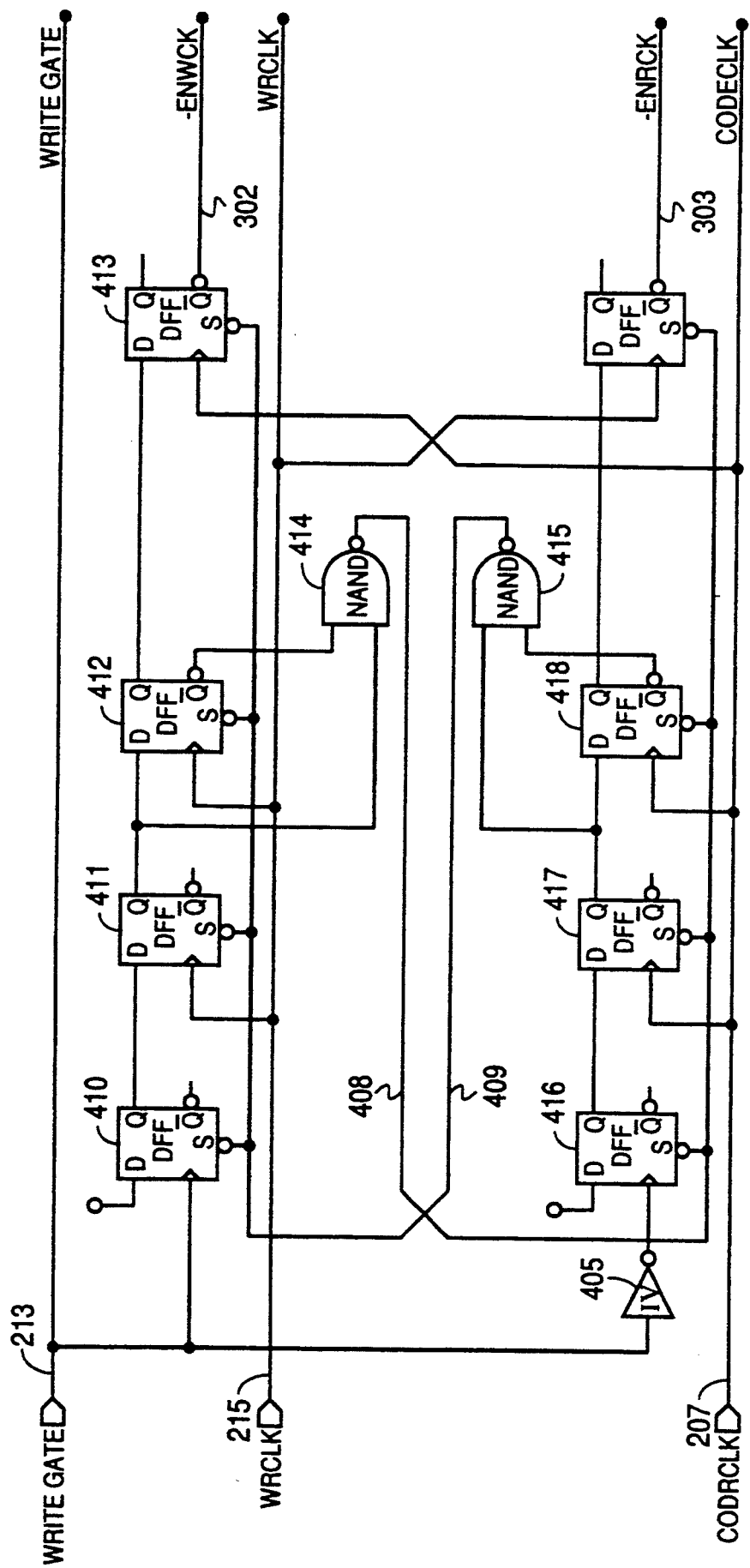
FIG. 4 is a circuit diagram of the clock swap logic circuit of this invention.

A more detailed schematic diagram of clock swap logic circuit 301 is presented in FIG. 4. If write gate 213 is deasserted, i.e, signal enable write clock 302 is initially active, the falling edge on line 213 to invertor 405 generates a positive edge to the clock terminal of D-type flip-flop 416. Consequently, D-type flip-flop 416 is clocked so that a logic one is at output terminal Q.

After one clock pulse on code clock line 207 after write gate 213 goes low, the signal on output terminal Q of flip-flop 417 to NAND gate 415 is a logic one and the signal of output terminal $\overline{Q}$ of flip-flop 418 to NAND gate 415 is a logic one. Consequently, the output signal from NAND gate 415 goes low.

The low signal from NAND gate 415 forces D-type flip-flops 410, 411, 412 and 413 into the reset mode so that the signal on enable write clock line 302 is driven high, i.e., inactive. On the next clock pulse on code clock line 207, the signal on output terminal Q of flip-flop 418 goes high and so the output signal of NAND gate 415 goes high. On the third clock pulse on code clock line 207 after write gate 213 goes low, terminal $\overline{Q}$ of flip-flop 419 goes low, which drives the signal on enable code clock line 303 active.

The signal on enable code clock line 303 remains active, until write gate is again asserted. When write gate 213 is asserted, there is a rising edge on line 213 to the clock terminal of D-type flip-flop 410. Consequently, D-type flip-flop 410 is clocked so that a logic one is at output terminal Q. After one clock pulse on write clock line 215 after write gate 213 goes active, the signal on output terminal Q of flip-flop 411 to NAND gate 414 is a logic one and the signal of output terminal $\overline{Q}$ of flip-flop 412 to NAND gate 414 is a logic one. Consequently, the output signal from NAND gate 414 goes low.

The low signal from NAND gate 414 forces D-type flip-flops 416, 417, 418 and 419 into the reset mode so that the signal on enable code clock line 303 is driven high, i.e., inactive. On the next clock pulse on write clock line 215, the signal on output terminal Q of flip-flop 412 goes high and so the output signal of NAND gate 414 goes high. On the third clock pulse on write clock line 215 after write gate 213 goes active, terminal $\overline{Q}$ of flip-flop 413 goes low, which drives the signal on enable write clock line 302 active.

Prior to considering the operation of read reference clock multiplexer 304 (FIG. 3) in more detail, it is informative to consider the operation of write clock skip logic 310 and read clock skip logic 320 that drives skip write clock line 313 and skip code clock line 323, respectively. Both of these circuits generate a signal that blanks the clock signal associated with the circuit so that the uncoded data and encoded data are both clocked at an appropriate frequency. For example, write clock skip logic 310 generates a signal to blank every third write clock pulse, in one embodiment.

Figure 5A:
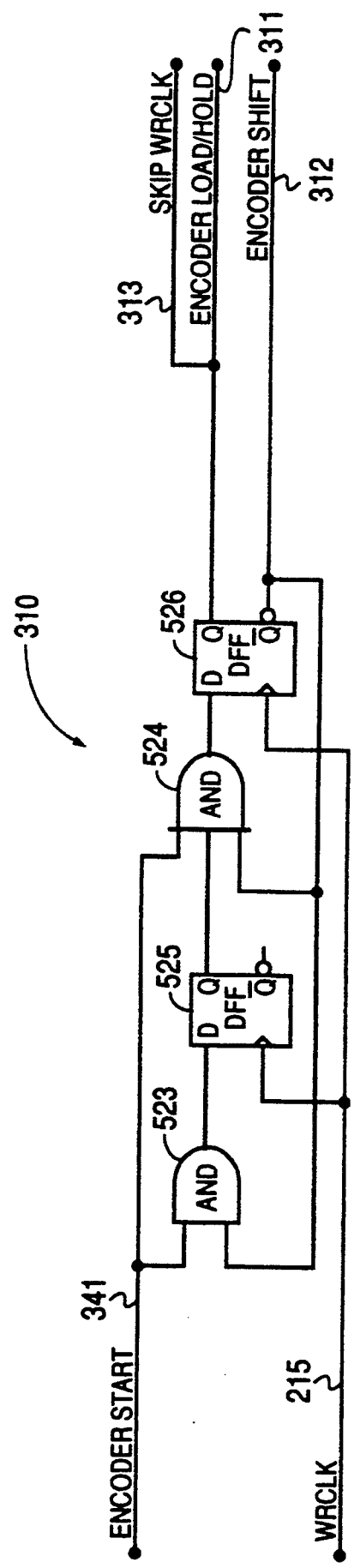
FIG. 5A is a circuit diagram of the write clock skip logic circuit of this invention.

FIG. 5A is a detailed schematic diagram of write skip logic circuit 310. Initially, encoder start signal 341 to AND gates 523 and 524 is low forcing a low output signal from both AND gates 523 and 524. These low signals are clocked through D-type flip-flops 525 and 526 by a clock pulse on write clock line 215. Therefore, the output signals from both flip-flops 525 and 526 are low. The low output signal of output terminal Q of flip-flop 526 drives skip write clock line 313 and encoder load/hold line 311. Output terminal $\overline{Q}$ of flip-flop 526 drives encoder shift line 312. Consequently, the signals on lines 311 and 313 are the complement of the signal on line 312. The signal on line 312 is also an input signal to AND gates 523 and 524.

Thus, initially, the signal on skip write clock line 313 is low. When encoder start signal 341 goes high, as described more completely below, the output signal from AND gate 523 goes high. A timing diagram for write skip logic circuit 310 is illustrated in FIG. 5B. Consequently, the output signal from flip-flop 525 goes high on the next clock pulse on write clock line 215 which in turn drives the output signal of AND gate 524 high. The high output signal of AND gate 524 is clocked through flip-flop 526 to skip write clock line 313 and encoder load/hold line 311 on the next clock pulse.

However, the low signal on terminal $\overline{Q}$ of flip-flop 526 drives the output signal of AND gates 523, 526 both low. Thus, on the next clock pulse the signal on skip write clock line 313 and encoder load/hold line 311 goes low. This process continues to repeat so long as encoder start signal 341 is active so that a one clock pulse wide pulse is generated on skip write clock line 313 to multiplexer 304 for every third clock pulse. Thus, when encoder start signal 341 is active, write skip logic circuit 310 functions as a synchronous divide by three counter. Similarly, the hold signal on encoder load/hold line 311 is generated after every mth clock pulse for a period of (n-m) clock periods on write clock line 215.

Figure 6A:
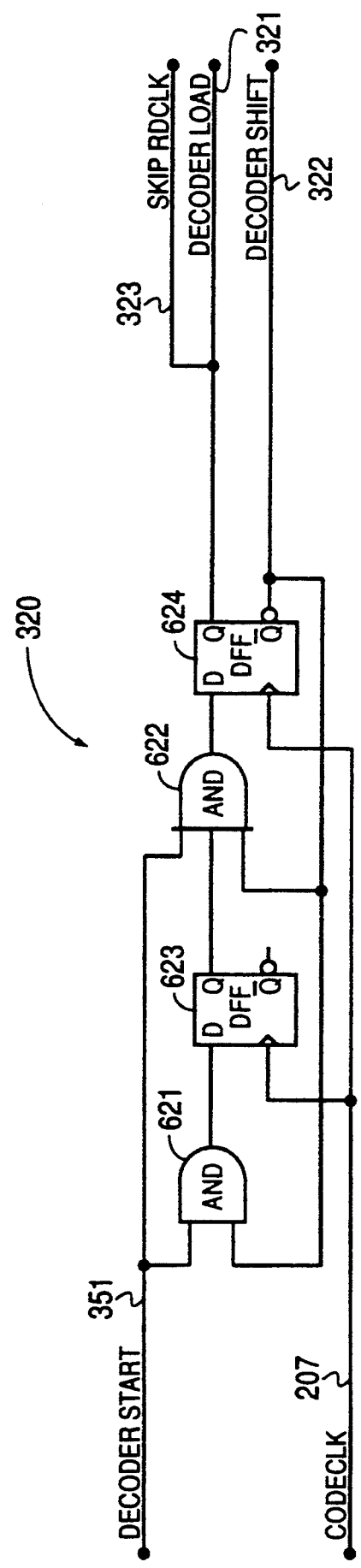
FIG. 6A is a circuit diagram of the code clock skip logic circuit of this invention.
Figure 6B:
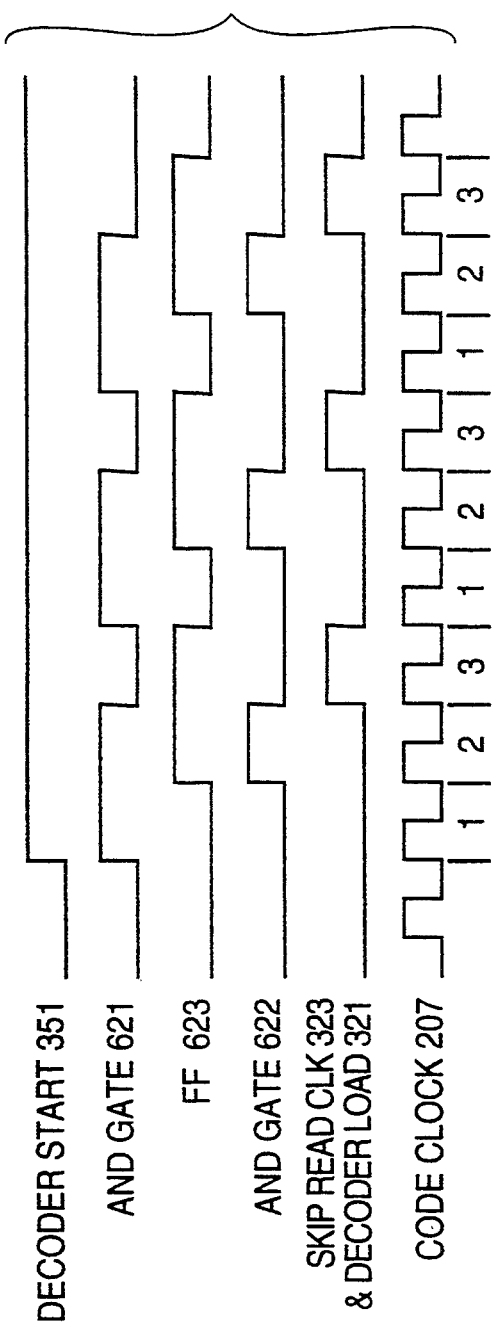
FIG. 6B is a timing diagram for the code clock skip logic circuit of this invention.

Read clock skip logic circuit 320 performs the same function for the code clock signal 207 as does write clock skip logic 310 for write clock signal 215. FIG. 6A is a detailed schematic diagram of one embodiment of read clock skip logic circuit 320 and FIG. 6B is a timing diagram. Notice that the basic structure of circuit 320 (FIG. 6A) is identical to that of circuit 310. Consequently, in view of the above discussion of circuit 310, the operation of read clock skip logic circuit 310 is apparent to those skilled in the art. The signals on skip code clock line 323 and decoder load line 321 are the complement of the signal on decoder shift line 322. Thus, when decoder start signal 351 is active, read skip logic circuit 320 functions as a synchronous divide by three counter.

With the above description of each of the input signals to read reference clock multiplexer 304, the operation of multiplexer 304 in swapping the signal source driving read reference clock line 211 from write clock 215 to code clock 207 based on which of the two clock selections signals is active and the blanking of the selected clock signal by the appropriated clock skip signal is now considered. An important aspect of the invention is that during clock swapping, only the high or low portion of a clock pulse is stretched. Accordingly, the swapping of the clock signal on read reference line 211 is done without cutting short any of the clock pulses of either clock signal.

Figure 7A:
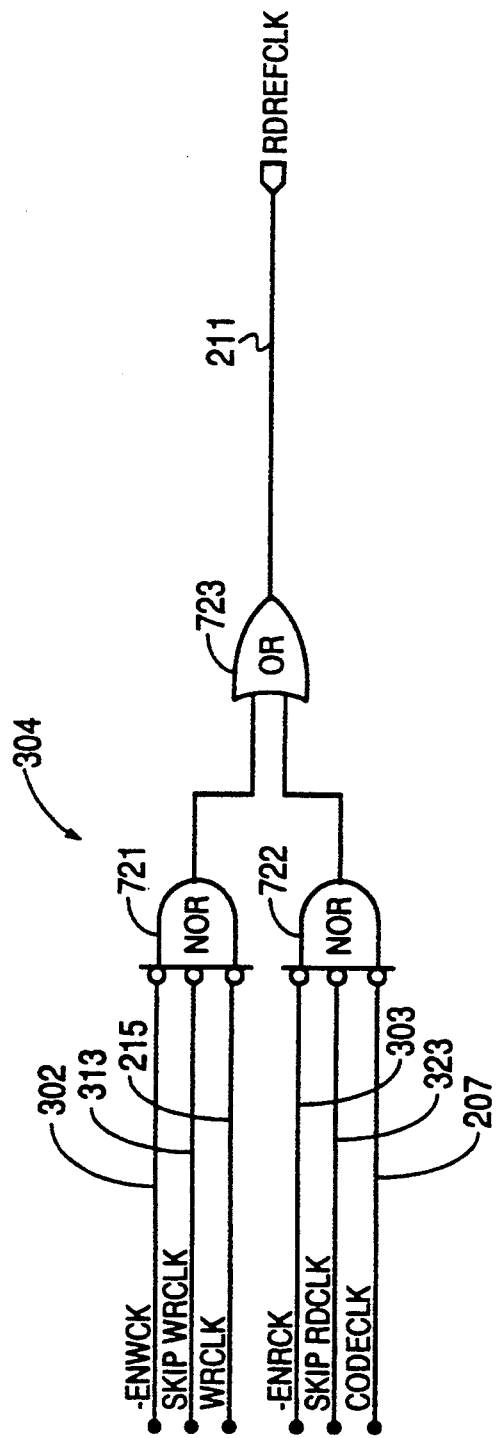
FIG. 7A is a circuit diagram of the read reference clock multiplexer of this invention.
Figure 7B:
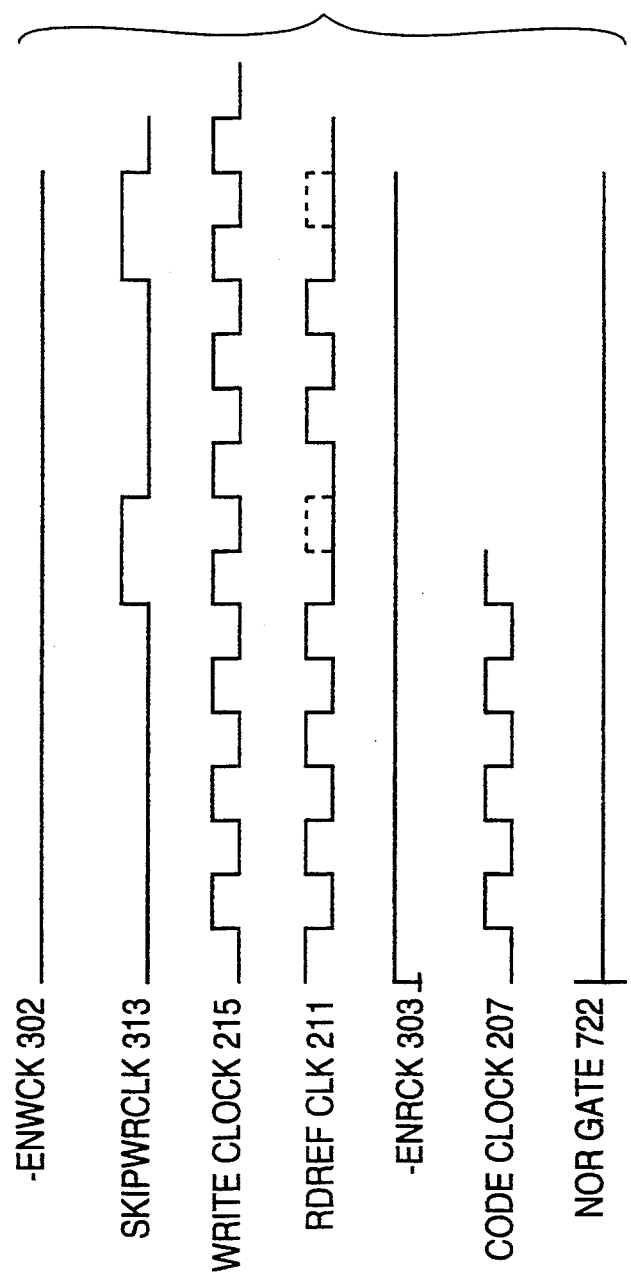
FIG. 7B is a timing diagram for the read reference clock multiplexer of this invention.

FIG. 7A is a schematic diagram of read reference clock multiplexer 304. FIG. 7B is a timing diagram for read reference clock multiplexer 304 where initially the write gate has been asserted and clock swap logic 301 (FIGS. 3 and 4) has driven enable write clock signal 302 active and enable code clock signal 303 low as described above.

When enable code clock signal 303 is high, the output signal of NOR gate 722 is held low and cannot oscillate. On the other hand, enable write clock signal 302 is low, and so the signal of write clock line 215 is selected to drive OR gate 723 and consequently read reference clock line 211. As illustrated in FIG. 7B, the signal on read reference clock line 211 initially is the inverse of the signal on write clock line 215.

However, when encoder start signal 341 goes active, write clock skip logic circuit 310 generates a one clock pulse wide pulse on skip write clock line 313 on every third clock pulse on line 215, as described above. As illustrated in FIG. 7B, the signal on skip write clock line 313 blanks one clock pulse, indicated by the dotted line, on read reference clock line 211. Consequently for every three code bits shifted from the encoder by write clock signal 215, two bits are shifted out of the disk controller 201 by read reference clock signal 211 and shifted into the encoder by write clock signal 215.

Again, the operation of read reference clock multiplexer 304 during decoding when the code clock is used is apparent in view of the above discussion, which is incorporated herein by reference. In the decoding process, the signal on enable code clock line 303 is active and the signal on skip code clock line 323 blanks every third clock pulse on code clock line 207. Thus, for every three clock pulses on code clock line 207, there are two clock pulses on read reference clock line 211.

Figure 8:
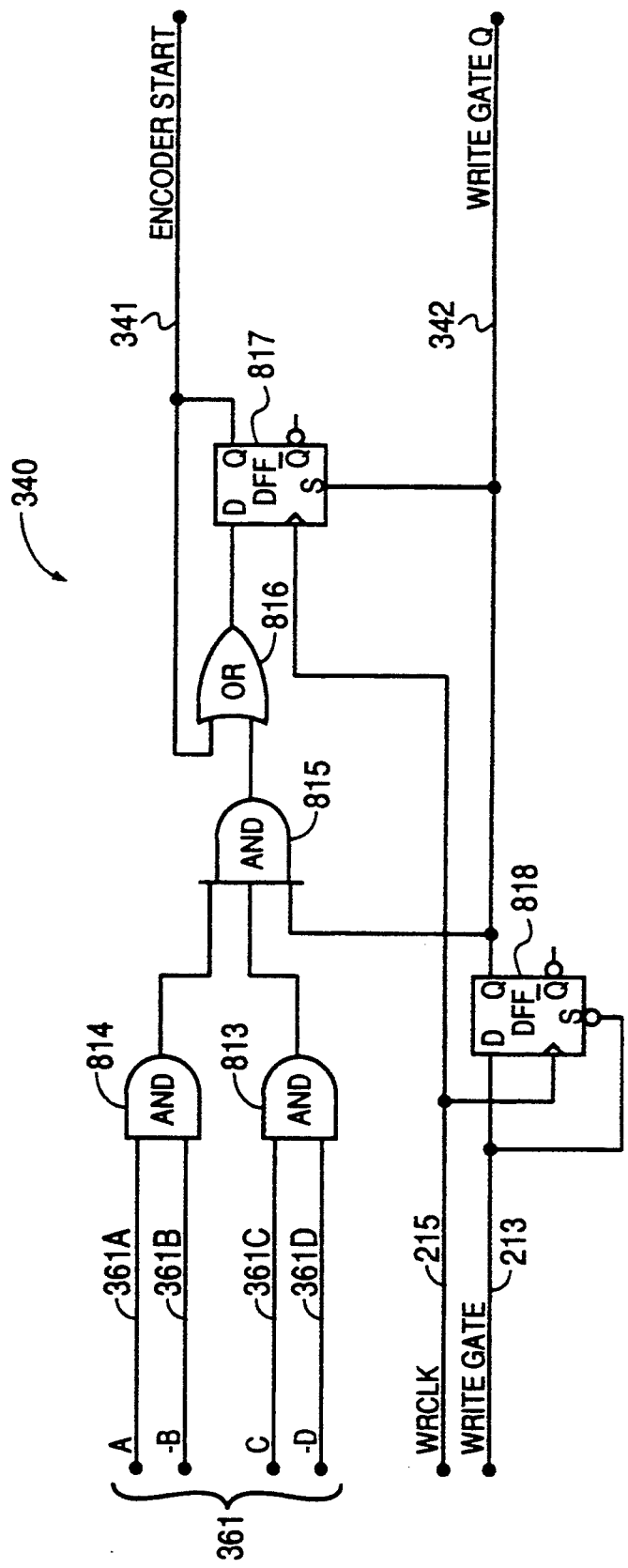
FIG. 8 is a circuit diagram of the encoder start logic circuit of this invention.

In the previous discussion, the signal on encoder start line 341 was simply assumed to go active. The signal on line 341 is driven active by encoder start logic circuit 340. FIG. 8 is a detailed schematic diagram of encoder start logic circuit 340 which generates encoder start signal 341 and write gate Q signal 342.

When write gate 213 is inactive, flip-flops 818 and 817 are held in reset mode. Consequently, the signals on lines 341 and 342 are both low. When write gate 213 is asserted, the next clock pulse on write clock line 215 transfers the logic one signal through flip-flop 818 so that the signal on write gate Q line 342 goes active.

As explained more completely below, the low signal on line 342 held the deserializer in encoder 360 (FIG. 3) in the reset mode. Consequently, the active signal on line 342 removes the reset on the deserializer. Moreover, as explained above, the signal on encoder shift line 312 from write clock skip logic circuit 310 to encoder 360 is active. Thus, data on NRZ write data in line 382 is shifted through the deserializer by the signal on write clock line 215.

The high signal on line 342 (FIG. 8) also takes flip-flop 817 out of the reset mode. However, the output signal from AND gate 815 is low, so that the signal on encoder start line 341 remains low.

Recall that after write gate 213 is asserted by disk controller 201, disk controller 201 transmits the predetermined sequence of data over NRZ data line 212. Since three-state buffer 380 (FIG. 3) is in the high impedance state, the predetermined sequence of data is transmitted through buffer 381 to NRZ write data in line 382. This predetermined sequence of data is clocked into encoder 360 by write clock signal 215.

The predetermined sequence of data from disk controller 201 is shifted through the deserializer of encoder 360. The contents of the first four stages of the deserializer are supplied on four line parallel bus 361A-361D to encoder start logic circuit 340. In this embodiment, the predetermined sequence of data is forty consecutive "10" data bits (10 bytes) which comprise the PLL sequence.

The first four bits "1010" are detected by encoder 360 and supplied on four line parallel bus 361A-361D to AND gates 813 and 814 which in turn both generate a high input signal to AND gate 815. The third input signal to AND gate 815 from flip-flop 818 is also high so that the output signal from AND gate 815 to OR gate 816 goes high. OR gate 816 passes the high input signal to input terminal D of flip-flop 817. On the next clock pulse on write clock line 215, the signal on encoder start line 341 goes high. Since the high signal is latched in flip-flop 817 and feedback to input terminal D through OR gate 217, the signal on encoder start line 341 remains active until after the write gate is deasserted.

As explained above, the high signal on encoder start line 341 to write clock skip logic circuit 310 (FIGS. 3 and 5A) results in the signal on encoder load/hold line 311 going active with every third clock pulse on write clock line 215, and the signal on shift encoder line 312 going inactive on every third clock pulse on write clock line 215. Consequently, encoder 360 starts to encode the remaining bits in the predetermined sequence of data, the sync word, and then the actual data supplied by the disk controller, as explained more completely below.

Figure 9:
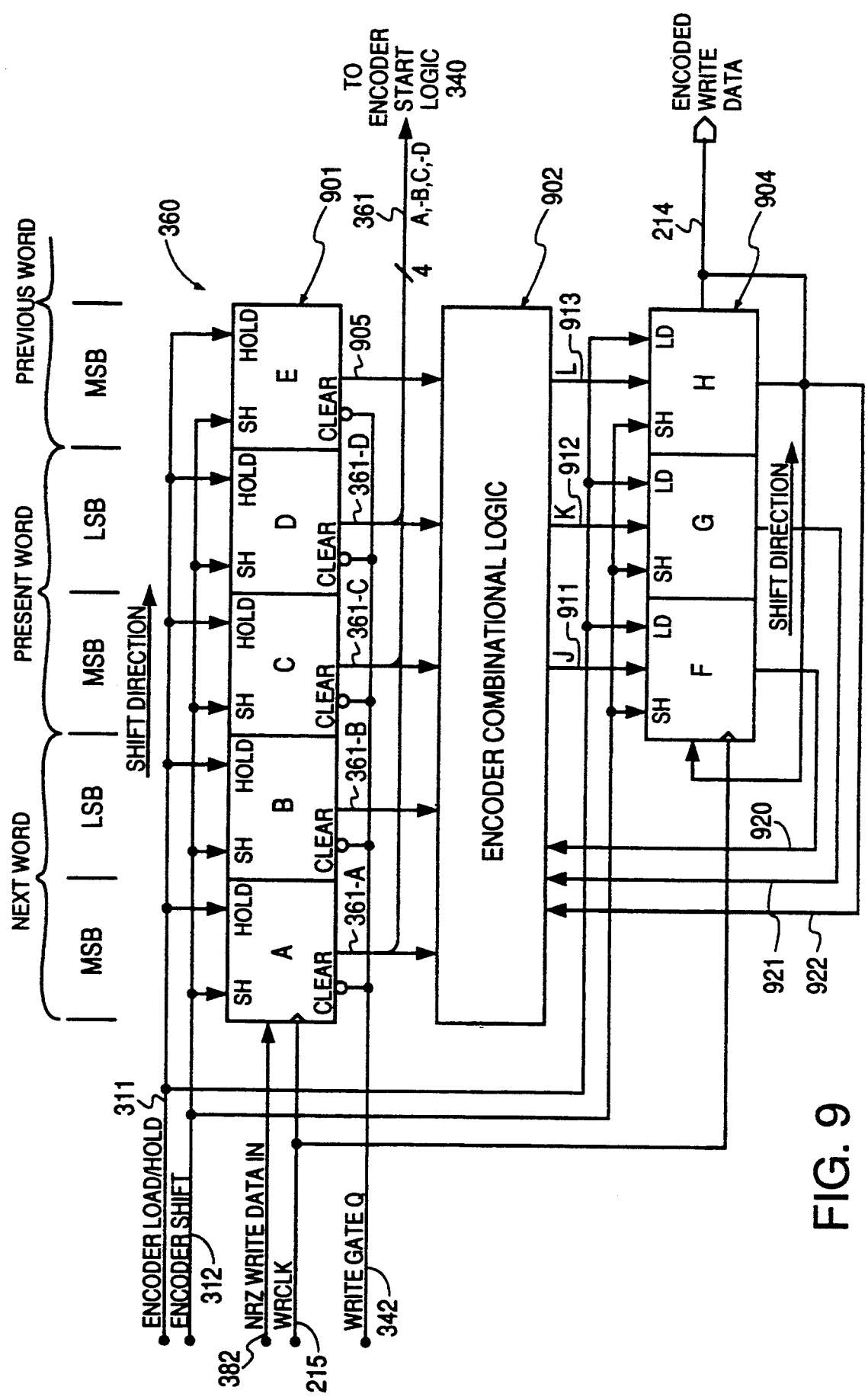
FIG. 9 is a more detailed block diagram of the encoder circuit of this invention.

FIG. 9 is a more detailed block diagram of encoder 360 of FIG. 3. Write gate Q signal 342 is applied to the clear terminals, which are active low, of flip-flops A-E in a five bit shift register 901, which is a deserializer. Thus, until after the write gate is asserted, shift register 901 is held in the cleared state. However, as explained above, on the first clock pulse on write clock line 215 after the write gate is asserted, the signal on write gate Q line 342 goes high and so shift register 901 is no longer in the clear mode.

Consequently, as just explained, the predetermined sequence of data is shifted through shift register 901 onto bus 361 to encoder combinatorial logic 902. When encoder start signal 341 goes active, encoder load/hold signal 311, which is supplied to hold input terminals "HOLD" of register 901, is high every third period of write clock 215. Similarly, encoder shift signal 312, which is the complement of encoder load/hold signal 311, is supplied to the shift enable input terminals "SH" (shift) of shift register 901. Write clock signal 215 generated from crystal reference 216 clocks each flip-flop A-E in shift register 901.

Consequently, two serial bits of data in the predetermined sequence of data are shifted into shift register 901 on two consecutive clock periods of write clock 215 and then the two bits are held for a third clock period of write clock 215. After the predetermined sequence of data and the sync byte, the data to be written to the disk is serially shifted into shift register 901 in the same manner.

In FIG. 9, the data is shifted from left to right. Accordingly, bit E is the oldest bit of data in shift register 901 and bit A is the youngest. Bits C and D contain the present two bit data word that is being encoded. Bits A and B contain the next two bit data word which is to be encoded next. Bit E contains bit C (MSB) of the previously encoded two bit data word. For ease of understanding, bits C and D are referred to as the present data word. Bits A and B are referred to as the next data word and the previous data word is the data word that was processed before the present data word.

Output signals from terminals 361A-361D, and 905 of five bits A-E of shift register 901 are supplied to encoder combinatorial logic circuit 902, which is described more completely below. However, encoder 360 is preferably self-contained in a single integrated circuit. This eliminates the separate ROM of the prior art system that was used to perform the encoding. The three bit code word J, K, L for the two bit data word in bits C and D of shift register 904 are applied in parallel over output lines 911-913 to a three bit shift register 904 which functions as a serializer.

Data is shifted through shift register 904 from left to right, from bit F to bit H, by the signal on write clock line 215. The output signal from bit H is fed back to the serial input of shift register 904 at bit F.

Like five bit shift register 901, three bit shift register 904 receives encoder load/hold signal 311 as well as encoder shift signal 312. However, encoder load/hold signal 311 is applied to terminal "LD" (load) of each flip-flop F-H in shift register 904 and encoder shift signal 312 is applied to terminal "SH" (shift) of each flip-flop F-H. Hence, while in shift register 901 on every third clock pulse the data is held in flip-flops A-E, the last bit is shifted out of shift register 904 on the third clock pulse and three new bits are loaded at the same time in parallel from encoder combinatorial logic circuit 902. The three output signals from the three stages F-H of shift register 904 are fed back to combinatorial logic block 902. Herein, "stage" "bit" and "flip-flop" are used interchangeably in reference to a shift register.

Encoder combinatorial logic circuit 902 contains the logic to implement the encoder translation table shown in Table 1 and Table 2 below. This coding method is a variation of what is known as (d,k: m,n)=(1,7:2,3) or 1,7 run length limited coding. In this method, two bit data words (m=2) are mapped to three bit (n=3) code words. The encoding rules specify that there must be at least one "0" between consecutive "1"s in the encoded bit stream (d=1). This is desirable to minimize inter-symbol interference. Also, the encoding rules for 1,7 run length limited coding require that the encoded bit stream have at most seven consecutive "0"s (k=7).

In Table 1, the column labeled "2 Bit Data Word" shows the four possible combinations for a two bit data word. The column labeled "3 Bit Code Word" shows the encoded three bit code word for data word in the same row of the table. Bit D is the first bit of the two bit data word shifted into shift register 201 and bit C is the second. In this embodiment, bit C is referred to as the most significant bit (MSB) of the two bit data word and bit D the least significant bit (LSB). Alternatively, bit D is a first bit of the data word and bit C is a second bit.

Bits J, K and L of the code word from encoder combinatorial logic 902 are loaded in parallel into shift register 904. Specifically, bit J is loaded into bit F, bit K into bit G and bit L into bit H of shift register 904, respectively. Bit H is the first code bit to be shifted out of shift register 204 and bit J is the last. Thus, using the same definition as for shift register 901, bit F (bit J) is the most significant bit and bit H (bit L) is the least significant bit.

TABLE 1

| Basic Coding State Table | | | | |
|---|---|---|---|---|
| 2 Bit Data Word | | 3 Bit Code Word | | |
| MSB | LSB | MSB | | LSB |
| C | D | J | K | L |
| 0 | 0 | 1 | 0 | 0 |
| 0 | 1 | 1 | 0 | 1 |
| 1 | 0 | 0 | 1 | 0 |
| 1 | 1 | 0 | 0 | 1 |

Notice that in Table 1, each of the three bit code words has at least one "1[" and none of the code words has two consecutive "1[s. To minimize inter-symbol interference, the serial stream of code bits from shift register 904 cannot contain two consecutive "1"s. Any combination of data words that result in a present code word ending with a "1" and the next code word starting with a "1" is an illegal condition, which is referred to as a collision. Hence, a collision occurs if the least significant bit of the present code word and the most significant bit of the previous code word are both a "1."

For example, when the data word pattern "01 01" is encoded according to Table 1, the resulting code words are "101 101," which results in a collision. In such a situation, as explained more completely below, the next data word is encoded so that the collision does not occur, i.e, the next data word is encoded as "000". Consequently, Table 1 is used for encoding unless a collision would occur. Therefore, encoding combinatorial logic 902 determines if a collision will occur and if so alters the encoding scheme.

Examination of the code words in Table 1 makes it possible to determine when a collision will occur. A collision can only occur when the most significant bit of the previous code word was a "1" and least significant bit of the present code word is a "1". This is possible only if bit D, the least significant bit, of the present data word is a "1" and if the most significant bit, of the previous data word was a "0". Special encoding rules, described below, are used to eliminate the collision when this data sequence occurs.

When a collision is detected, the code word for the present data word is replaced with a code word of "000." If such a colliding code word were merely replaced with "000" however decoding becomes ambiguous. Specifically, decoder 370 can not determine which of the two possible data words, CD="01" and CD="11" was replaced with the code word "000". Data word, CD="01" normally is encoded to code word, JKL="101" and data word, CD="11[ normally is encoded to code word, JKL=∂001[. In each case, the least significant bit of the present code work is a "1" and would collide with a previous code word ending in "1".

In this situation, the least significant bit of the data word was a "1[ but the most significant bit of the data may be either a "0" or a "1". Thus, simply replacing the code word with "000" when a collision is detected is not sufficient to permit unambiguous decoding of the encoded data. Additional information must be supplied to differentiate between the two possible data words, CD="01" or CD="11" which actually generated the code word JKL="000". In this embodiment, the necessary information to resolve the ambiguity is encoded in the previous code word.

The encoding of Table 1, the detection of a collision and the resulting encoding are performed by encoder combinatorial logic circuit 902 according to the following boolean expressions:

Force zero value:
  FZ = /E * (F + G + H) * D
First present code word bit L (LSB):
  L = /FZ * D
Second present code word bit K:
  K = (C * /D) + (A * B * /D)
Last present code word bit J (MSB):
  J = /FZ * /C * (/A + /B)
where
  / = Logic NOT    * = Logic AND
  + = Logic OR Table 2 illustrates each of the different data combinations that may be encountered in shift register 901. The contents of bits A-E of shift register 901 are in the columns labeled A through E respectively. Bits C and D represent the present data word. Bit E is most significant bit of the previous data word. Bits A and B represent the next data word.

The column labeled FZ represents the force zero value, as explained more completely below. The columns labeled J through L represent the code word that is generated according to the above Boolean expressions for the present data word surrounded by the previous data word and the next data word as shown in the same row.

TABLE 2

| | Next Data Word | | Present Data Word | | MSB of Previous Data Word | | Code Word For Present Data Word | | |
|---|---|---|---|---|---|---|---|---|---|
| | MSB A | LSB B | MSB C | LSB D | MSB E | FZ | MSB J | K | LSB L |
| a. | X | 0 | 0 | 0 | X | X | 1 | 0 | 0 |
| b. | X | 0 | 0 | 1 | 1 | 0 | 1 | 0 | 1 |
| c. | X | X | 1 | 0 | X | X | 0 | 1 | 0 |
| d. | X | X | 1 | 1 | 1 | 0 | 0 | 0 | 1 |
| e. | 0 | 1 | 0 | 0 | X | X | 1 | 0 | 0 |
| f. | 0 | 1 | 0 | 1 | 1 | 0 | 1 | 0 | 1 |
| g. | 1 | 1 | 0 | 0 | X | X | 0 | 1 | 0 |
| h. | 1 | 1 | 0 | 1 | 1 | 0 | 0 | 0 | 1 |
| i. | X | X | X | 1 | 0 | 1 | 0 | 0 | 0 |

X = don't care

Recall that a collision required the least significant bit, bit D, of the present word to be a one and the most significant bit, bit E, of the previous word to be a zero. This situation is the same as when the most significant bit, bit C, of the present word is a zero and the least significant bit, bit B, of the next word is a one. Thus, rows a, b, c, and d in Table 2 are conditions in which a collision does not occur. Therefore, the present data word is encoded by encoder combinatorial logic circuit 902 using the rules of Table 1 as expressed in the boolean expressions given above.

The conditions of rows e, f, g and h, on the other hand, are conditions in which the normal coding of the next data word collides with the present code word. In each of these examples, the least significant bit, bit B, of the next data word is a "1" and the most significant bit, bit C, of the present data word is a "0". Thus, in each of these examples, the next data word is encoded as "000" and the present data word is encoded so that the decoding is unambiguous.

Specifically, the most significant bit, bit J, of the code word for the present data word is encoded as the complement of the most significant bit of the next data word. The following discussion is intended to assist in understanding of the operation of decoder combinatorial logic circuit 902. The actual operations performed by logic circuit 902 are controlled exclusively by the boolean expressions given above.

In row e, present data word "00" is normally encoded as code word "100". However, since a collision condition is detected, the most significant bit "1" of the code word is encoded as the complement of the most significant bit, bit A, which is a "0," of the next data word. Since the complement of zero is one, the code word for present data word "00" is not changed.

In row f, present data word "01" is normally encoded as code word "101". However, since a collision condition is detected, the most significant bit "1" of the code word is encoded as the complement of the most significant bit, bit A, which is a "0" of the next data word. Since the complement of zero is one, the code word for present data word "01" is not changed.

In row g, present data word "00" is normally encoded as code word "100". However, since a collision condition is detected, the most significant bit "1" of the code word is encoded as the complement of the most significant bit, bit A which is a "1," of the next data word. Since the complement of one is zero, the code word for present data word "01" is changed to the code word "000". However, the next data word is also encoded as "000."

Consequently, if the data sequence was "00", "11", "00", "xx" the limitation of a maximum of seven encoded zeros would be violated, because the data stream of "00", "11", "00" would be encoded as "100", "000", ∂000" which has eight consecutive zeros. Further, if data word "xx" is "11" there are ten consecutive zeros. Consequently, in this case, i.e, the next data word is "11" and the present data word is "00" the most significant bit in the code word is the complement of the most significant bit of the next data word and the middle bit of the code word is driven to a one. Examination of the above boolean equations shows that this is indeed the result.

In row h, present data word "01" is normally encoded as code word "101". However, since a collision condition is detected, the most significant bit "1" of the code word is encoded as the complement of the most significant bit, bit A which is a "1," of the next data word Since the complement of zero is one, the code word for present data word "01" is changed to "001."

Finally, row i demonstrates the encoding of the present data word as code word "000" when a collision is detected.

Notice that Boolean equation FZ, the complement of which forces the most significant and least significant bits to zero, requires the values of the previous code word in shift register 904. Consequently, as the previous code word, bits F, G and H, is serially shifted out, the contents of three bit shift register 904 are recirculated as the code word F, G and H is shifted out. This recirculation is possible because the output of bit H is fed back to the serial input of bit F, as described above.

Accordingly, in the last clock period of write clock 215 as encoder load/hold signal 311 parallel loads three bit shift register 904 with output signals J,K,L of combinatorial logic 902, shift register 904 still contains the previous code word F, G, and H for the previous data word. This code word is fed into encoder combinatorial logic circuit 902 so that the combinatorial logic can output code bits J, K, and L in accordance with the boolean expressions given above.

Figure 10A:
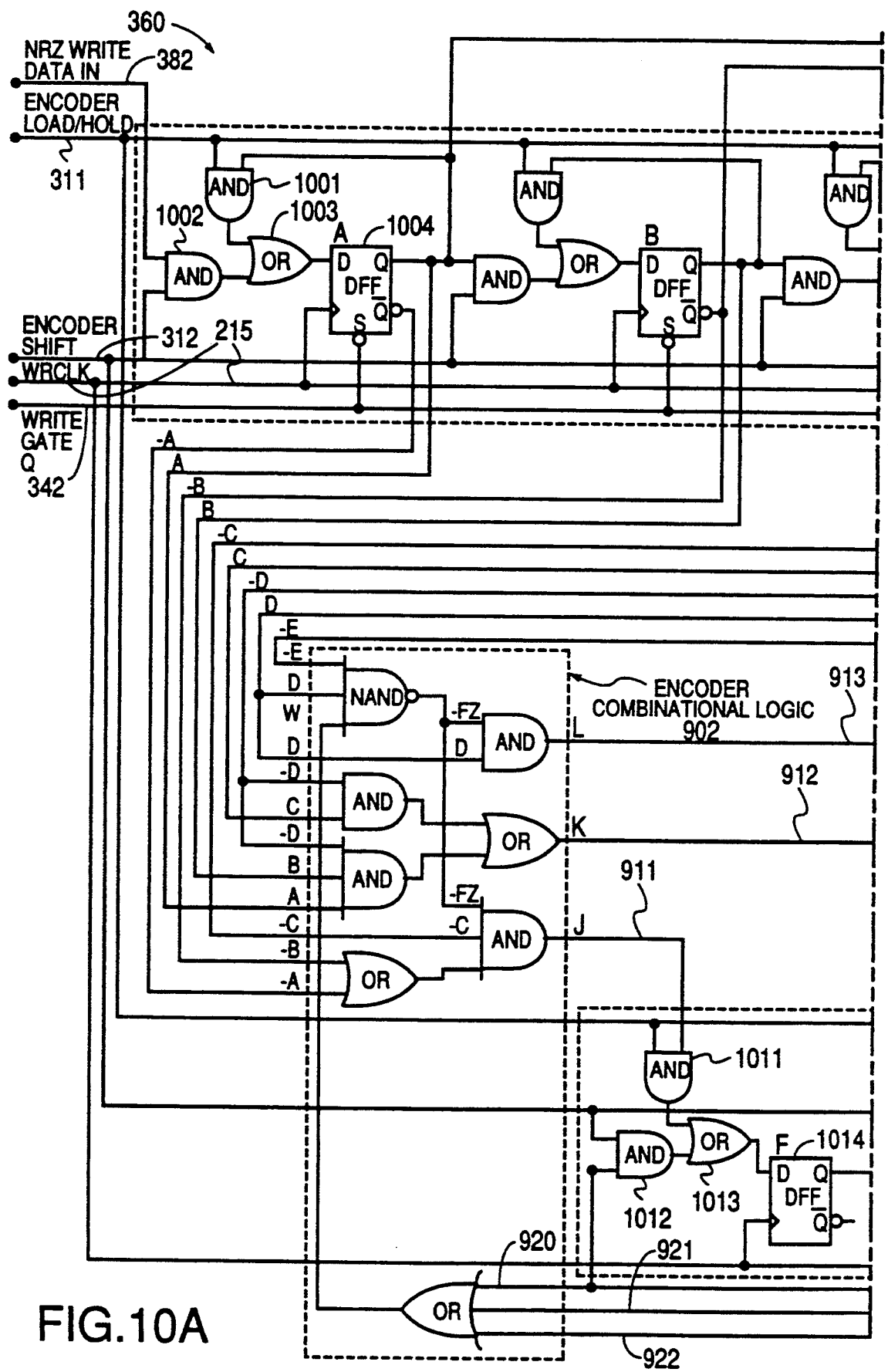
FIGS. 10A and 10B are circuit diagrams of the encoder circuit of this invention.
Figure 10B:
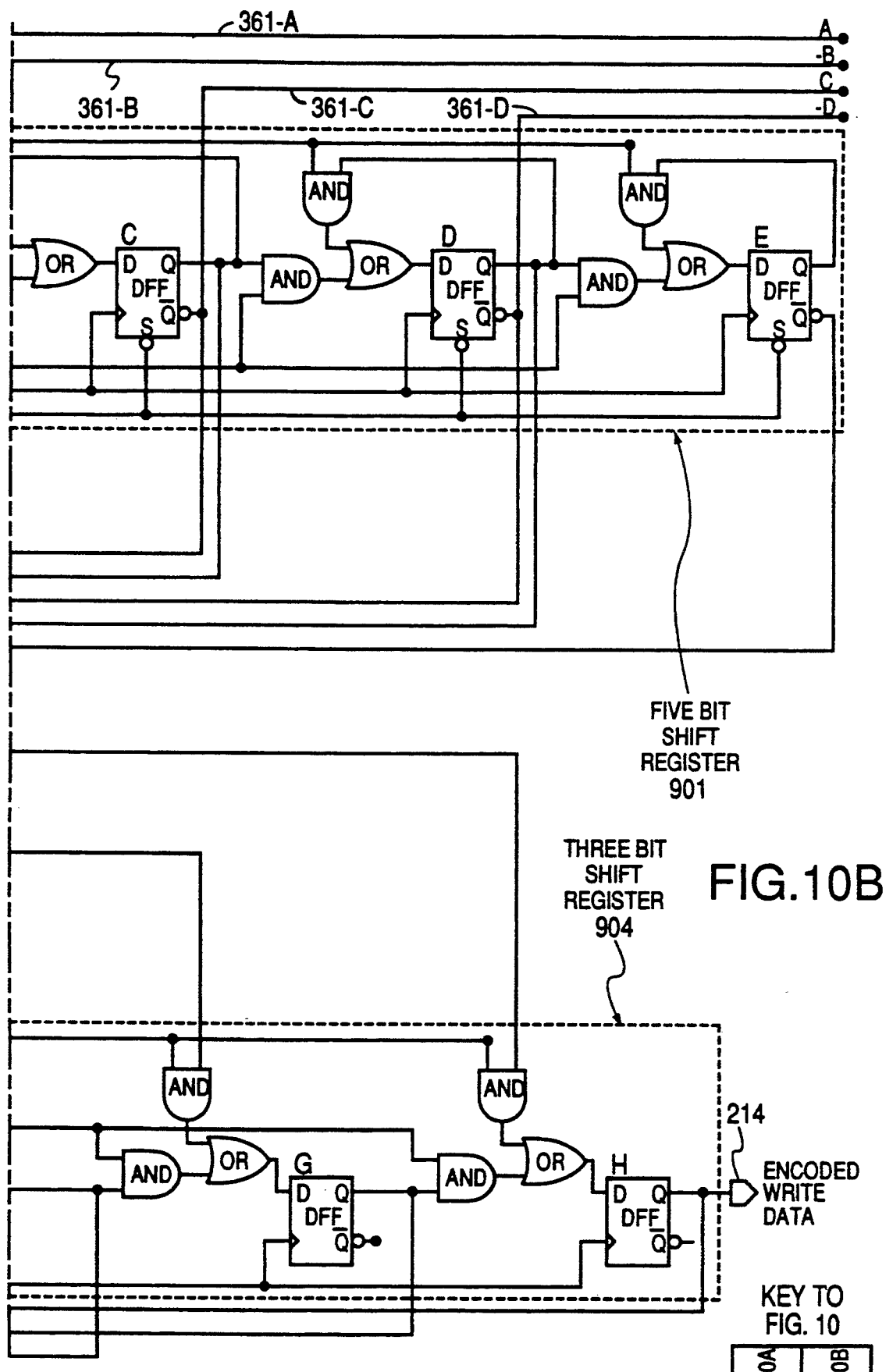

FIG. 10 is a detailed circuit diagram of encoder logic circuit 360 (FIG. 3). Five bit shift register 901 is contained within dotted box B1. Encoder combinatorial logic circuit 902 is contained within dotted box B2 and three bit shift register 904 is contained within dotted box B3.

In five bit shift register 901, the first stage, bit A, includes an asynchronously resettable D-type flip-flop 1004. AND gate 1001 and OR gate 1003 feed the signal on output terminal Q of flip-flop 1004 back to input terminal D of flip-flop 1004 so that shift register 901 can perform the hold function when encoder load/hold signal 311 is high and encoder shift signal 312 is low.

When encoder load/hold signal 311 is low and encoder shift signal 312 is high, on the other hand, AND gate 1002 and OR gate 1003 form a serial load input path from NRZ write data in line 382 to input terminal D of flip-flop 1004. Each of the remaining bits B-E of shift register 901 has circuitry corresponding to the circuitry of bit A.

In three bit shift register 904, the first stage, bit F, comprises flip-flop 1014. AND gate 1011 and OR gate 1013 form a load path to input terminal D of flip-flop 1014 when encoder load/hold signal 311 is high and encoder shift signal 312 is low. If, on the other hand, encoder load/hold signal 311 is low and encoder shift signal 312 is high, AND gate 1012 and OR gate 1013 form a serial input path to input terminal D of flip-flop 1014. The other stages G and H of shift register 904 are of similar construction.

When the write to the disk is completed, disk controller 201 deasserts the write gate. Consequently, as explained above, clock swap logic circuit 301 (FIGS. 3 and 4) swaps the clock signal on read reference clock line 211 from write clock 215 to code clock 207. When the host computer requests data from the disk, disk controller 201 (FIG. 2) generates a read gate signal on line 210 to data synchronizer 202B a predetermined period of time after receiving the sector pulse on line 219. When data synchronizer 202B of R/W combo integrated circuit 202 receives the read gate on line 210, data synchronizer 202B begins looking for a preamble sequence, i.e., the PLL sequence in the encoded data which is "010 010 . . .".

When the preamble is detected by data synchronizer 202B, e.g., typically, four bytes of the encoded PLL data, a preamble detect signal is sent to encoding/decoding system 200 on line 209. As illustrated in FIG. 3, the preamble detect signal drives decoder start logic 350.

Figure 11:
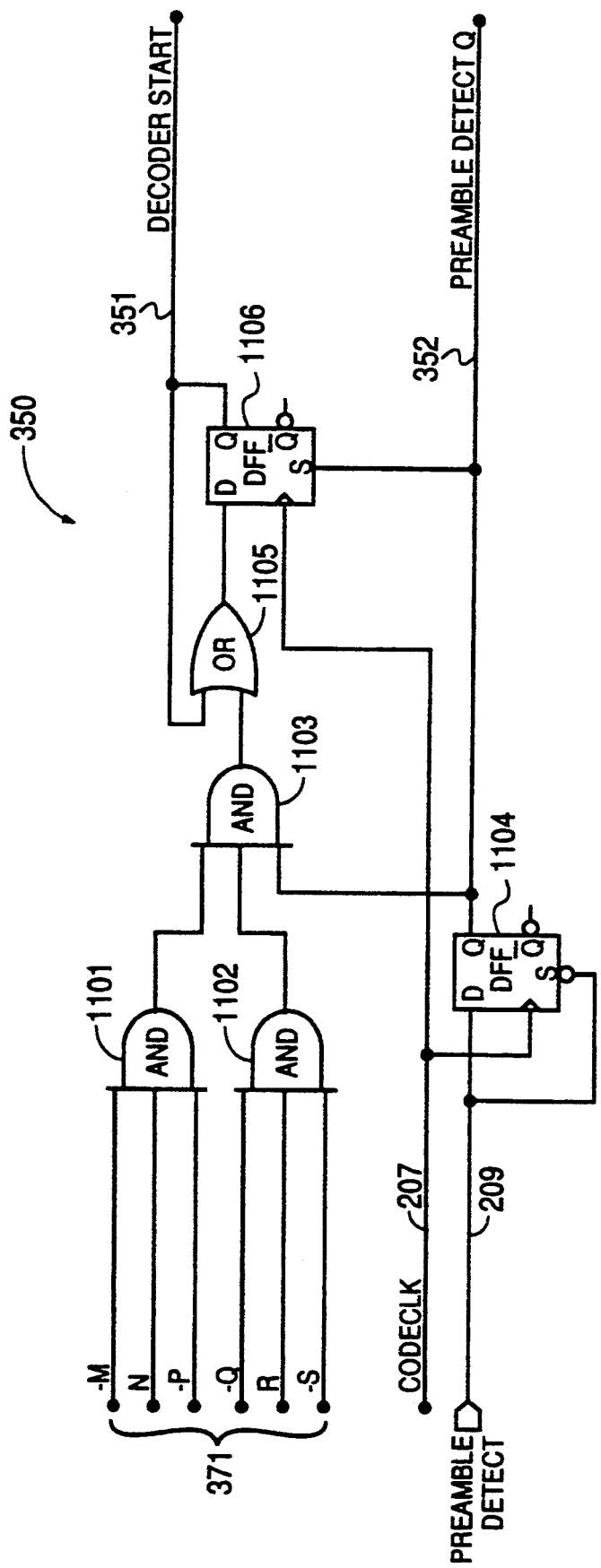
FIG. 11 is a circuit diagram of the decoder start logic circuit of this invention.

FIG. 11 is a detailed schematic diagram of decoder start logic circuit 350 which generates decoder start signal 351 and preamble detect Q signal 352. When preamble detect signal 209 is inactive, flip-flop 1104 and 1106 are held in reset mode. Consequently, the signals on lines 351 and 352 are both low. When preamble detect signal 209 goes active, the next clock pulse on code clock line 207 transfers the logic one signal through flip-flop 1104 so that the signal on preamble detect Q line 352 goes active.

As explained more completely below, the low signal held the first six bits of the deserializer/serializer in decoder 370 (FIG. 3) in the reset mode. Consequently, the active signal on line 352 removes the reset on the first six bits of deserializer/serializer. Moreover, as explained above, the signal on decoder shift line 322 from read clock skip logic circuit 320 to decoder 370 is active. Thus, data on code data line 208 is shifted through the deserializer/serializer by the signal on code clock line 207.

The high signal on line 352 (FIG. 11) also takes flip-flop 1106 out of the reset mode. However, the output signal from AND gate 1103 is low, so that the signal on decoder start line 351 remains low. The encoded predetermined sequence of data from the disk on code data line 208 is shifted through shift register 1201 of encoder 370, and the contents of the first stages of shift register are supplied on six line parallel bus 371A-371F to decoder start logic circuit 350. In this embodiment, the predetermined sequence of data was encoded as "010 010 . . . ". Note, however, as explained more completely below, at this time data is not being supplied to NRZ read data out line 372 from decoder 370.

The first six bits "010010" are detected by decoder 370 and supplied on six line parallel bus 371A-371D to AND gates 1101 and 1102 which in turn both generate a high input signal to AND gate 1103. The third input signal to AND gate 1103 from flip-flop 1104 is also high so that the output signal from AND gate 1103 to OR gate 1105 goes high.

OR gate 1105 passes the high input signal to input terminal D of flip-flop 1106. On the next clock pulse on code clock line 207, the signal on decoder start line 351 goes high. Since the high signal is latched in flip-flop 1106 and feedback to input terminal D through OR gate 1105, the signal on decoder start line 351 remains active until after the preamble detect signal is deasserted. Preamble detect signal 209 is deasserted by data synchronizer 202B when the read gate is deasserted.

As explained above, the high signal on decoder start line 351 to read clock skip logic circuit 320 (FIGS. 3 and 6A) results in the signal on decoder load line 321 going active with every third clock pulse on code clock line 207, and the signal on decoder shift line 312 going inactive on every third clock pulse on code clock line 207. Consequently, decoder 370 starts to decode the remaining bits in the predetermined sequence of encoded data, the encoded sync word, and then the actual encoded data from the disk.

Figure 12:
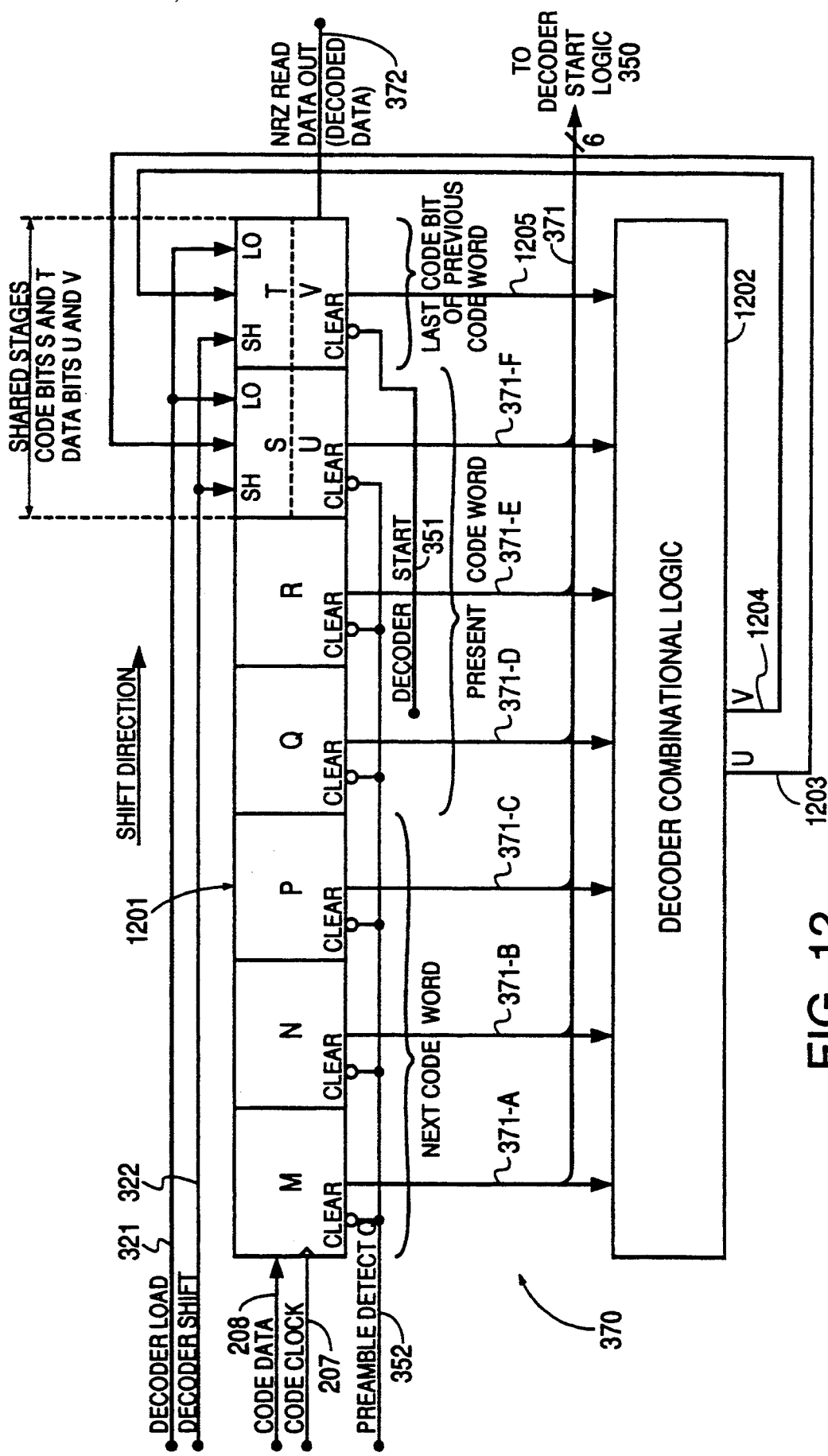
FIG. 12 is a block diagram of the decoder circuit of this invention.

FIG. 12 is a block diagram of decoder 370. Preamble detect Q signal 352 is applied to the clear terminals, which are active low, of flip-flops M-S in a seven bit shift register 1201, which is a deserializer/serializer. Decoder start signal 351 is applied to the clear terminal, which is active low, of flip-flop T of shift register 1201.

Thus, until after the preamble detect signal is asserted, bits M-S of shift register 1201 are held in the cleared state. However, as explained above, on the first clock pulse on code clock line 207 after the preamble detect signal is asserted, the signal on preamble detect Q line 352 goes high and so bits M-S of shift register 1201 is no longer in the clear mode.

Consequently, as just explained, the predetermined sequence of encoded data is shifted through bits M-S of shift register 1201 onto bus 371. When decoder start signal 351 goes active, decoder load signal 321, which is supplied to load input terminals "LD" of bits S and T of register 901, is high during every third period of code clock 207. Similarly, decoder shift signal 322, which is the complement of decoder load signal 321, is supplied to the shift enable input terminals "SH" bits S and T of shift register 1201. The clear signal on bit T of shift register 1201 is dropped. Code clock signal 207 generated by data synchronizer 202B (FIG. 2) clocks each flip-flop A-T in shift register 1201. Consequently, data is shifted into shift register 1201 and as explained more completely below, decoded data is shifted out on NRZ read data out line 372.

In FIG. 12, the data is shifted from left to right. Accordingly, bit T is the oldest bit of encoded data in shift register 1201 and bit M is the youngest. Bits Q, R, and S contain the present three bit code word that is being decoded where bit Q is the most significant bit and bit S is the least significant bit. Bits M, N, and P contain the three bit code word which is decoded next, where bit M is the most significant bit and bit P is the least significant bit. Bit T contains bit Q (MSB) of the previously decoded three bit code word. For ease of understanding, bits Q, R, and S are referred to as the present code word. Bits M, N, and P are referred to as the next code word and the previous code word is the code word that was processed before the present code word.

Output signals on line 371A–371F, and 1205 of seven bits M-T of shift register 1201 are supplied in parallel to decoder combinatorial logic circuit 1202, which is described more completely below. However, decoder 370 is preferably self-contained in a single integrated circuit with the other circuitry in encoding/decoding system 200. This eliminates the separate ROM and multiple shift registers of the prior art system that was used to perform the decoding process.

The two bit data word U, V from decoder combinatorial logic circuit 1202 for the three bit code word in bits Q, R, and S of shift register 1201 are loaded in parallel over output lines 1203 and 1204 into bits S and T of shift register 1201 when the signal on decoder load line 321 is active. As explained more completely below, only the most significant bit of the present code word is required for decoding the next code word. Consequently, only bit Q must be preserved. Therefore, as data word U and V are loaded into bits S and T and the next code word shifted into shift register 1201, data word U and V is shifted out over NRZ read data out line 372. When the next code word is in the present code word position, bit Q has been shifted to bit T and the data word is shifted out.

Decoder combinatorial logic circuit 1202 decodes the present code word according to the following boolean expressions:

Zero value:
$Z = (P + N + M)$

Bit V of data word(LSB):
$V = (/R * S) + (/Q * /R)$
Bit U of data word(MSB):
$U = (Z*S*/R*/Q) + (Z*/S*R*/Q) + (/Q*/R*/S*/T)$ where
/ = Logic NOT    * = Logic AND
+ = Logic OR The operation of decoder combinatorial logic circuit 1202 is demonstrated by the examples in Table 3 below.

TABLE 3

| | Present Code Word | | | MSB of Previous Code Word | Present Decoded Data Word | |
|---|---|---|---|---|---|---|
| Zero $M + N + P$ | MSB Q | R | LSB S | MSB T | MSB U | LSB V |
| j. | X | 1 | 0 | 0 | X | 0 | 0 |
| k. | X | 1 | 0 | 1 | X | 0 | 1 |
| l. | 1 | 0 | 1 | 0 | X | 1 | 0 |
| m. | 1 | 0 | 0 | 1 | X | 1 | 1 |
| n. | 0 | 0 | 1 | 0 | X | 0 | 0 |
| o. | 0 | 0 | 0 | 1 | X | 0 | 1 |
| p. | X | 0 | 0 | 0 | 0 | 1 | 1 |
| q. | X | 0 | 0 | 0 | 1 | 0 | 1 |

X = don't care

In Table 3, the column labeled "Zero" is the logic OR function of the bits in the next code word. If the logic OR function is zero, it indicates a collision and so the present code word was encoded using the special encoding method described above so the next code word can be unambiguously decoded. The labels on the other columns make the information in the columns self explanatory. Each row shows the configuration in shift register 1201 and the resulting data word U, V generated by decoder combinatorial logic circuit 1202.

Rows j and k of Table 3 correspond to rows e and f respectively of Table 2. Recall that code word "100" was encoded for data word "00" irrespective of whether a collision occurred because the complement of zero is one and the only conditions under which a collision could occur was when the most significant bit of the next data word was a zero. Similarly, code word "101" was encoded for data word "01" irrespective of whether a collision occurred because the complement of zero is one and the only conditions under which a collision could occur was when the most significant bit of the next data word was a zero. Therefore, the decoding of code words "100" and "101" are straightforward.

The code words in rows 1 and m of Table 3 are decoded normally because the next code word is not "000" as indicated by column "Zero". Consequently, a collision was not detected and the data words were encoded normally.

In rows n and o, however, the logic OR function of the bits in the next code word is a logic zero, which indicates that a collision was detected and so the special encoding methods were used. Recall that the data word "00" was encoded as "010" when a collision was detected so as not to violate the requirement of a maximum of seven consecutive zeros. Examination of the above boolean expressions shows that when the code word is "010" and the logic OR function of the next code word is a "0" the code word "010" is decoded as "00".

For row o, the boolean expression also generates the correct result. However, in this case, since the next code word is "000" the complement of the most significant bit of the present code word is substituted for the most significant bit and the resulting code word is decoded. Thus, code word "001" becomes "101" which is decoded as "01".

In rows p and q, the present code word is "000." As explained above, the least significant bit of the data word giving rise to the "000" is always a "1." Therefore, bit V is a "1" for both rows p and q. To determine the most significant bit of the data word, the complement of the most significant bit of the previous code word, bit T, is taken. Decoded bit U in rows p and q is therefore the complement of bit T as shown in Table 3.

Figure 13A:
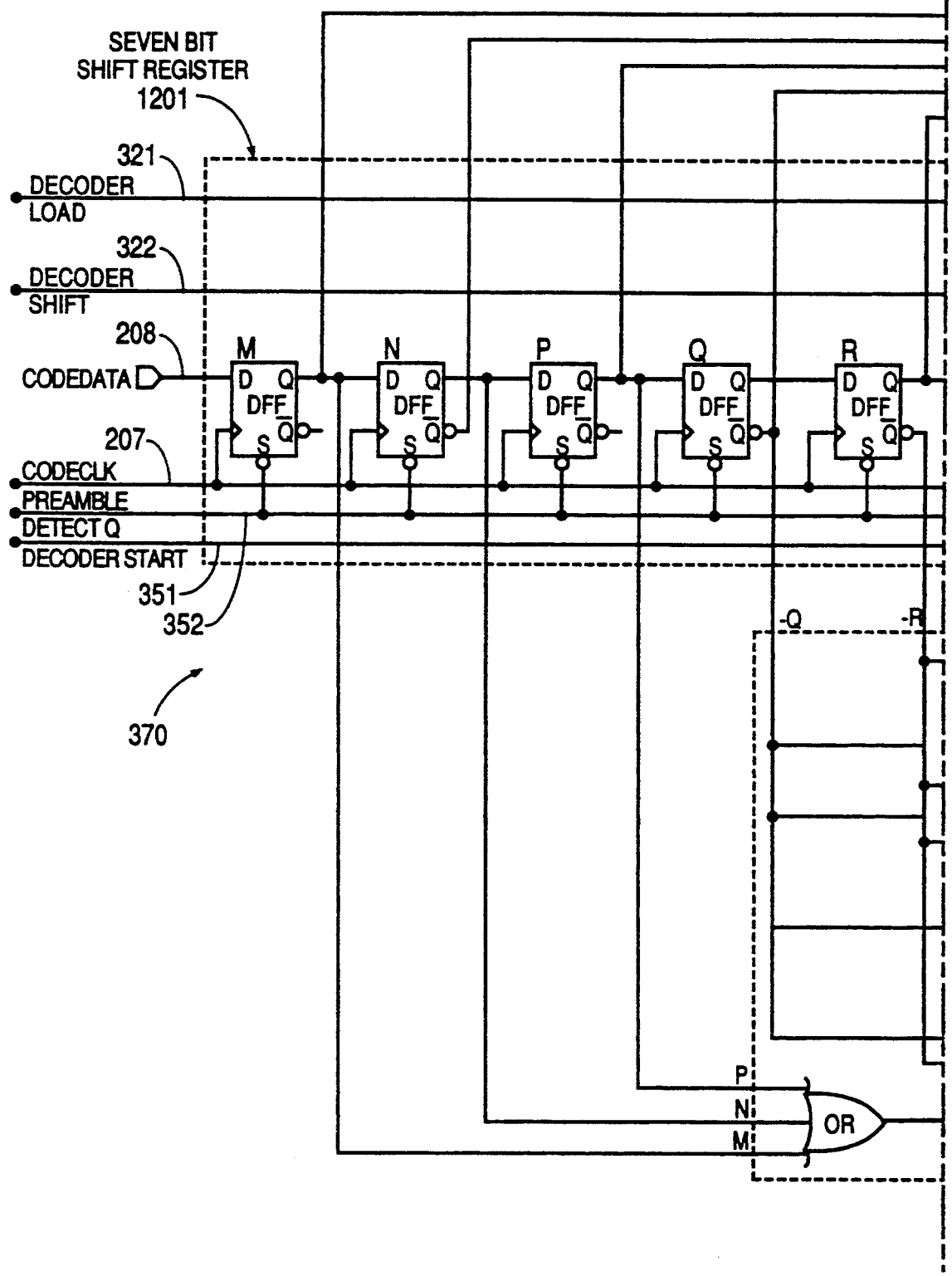
FIGS. 13A and 13B are circuit diagrams of the decoder circuit of this invention.
Figure 13B:
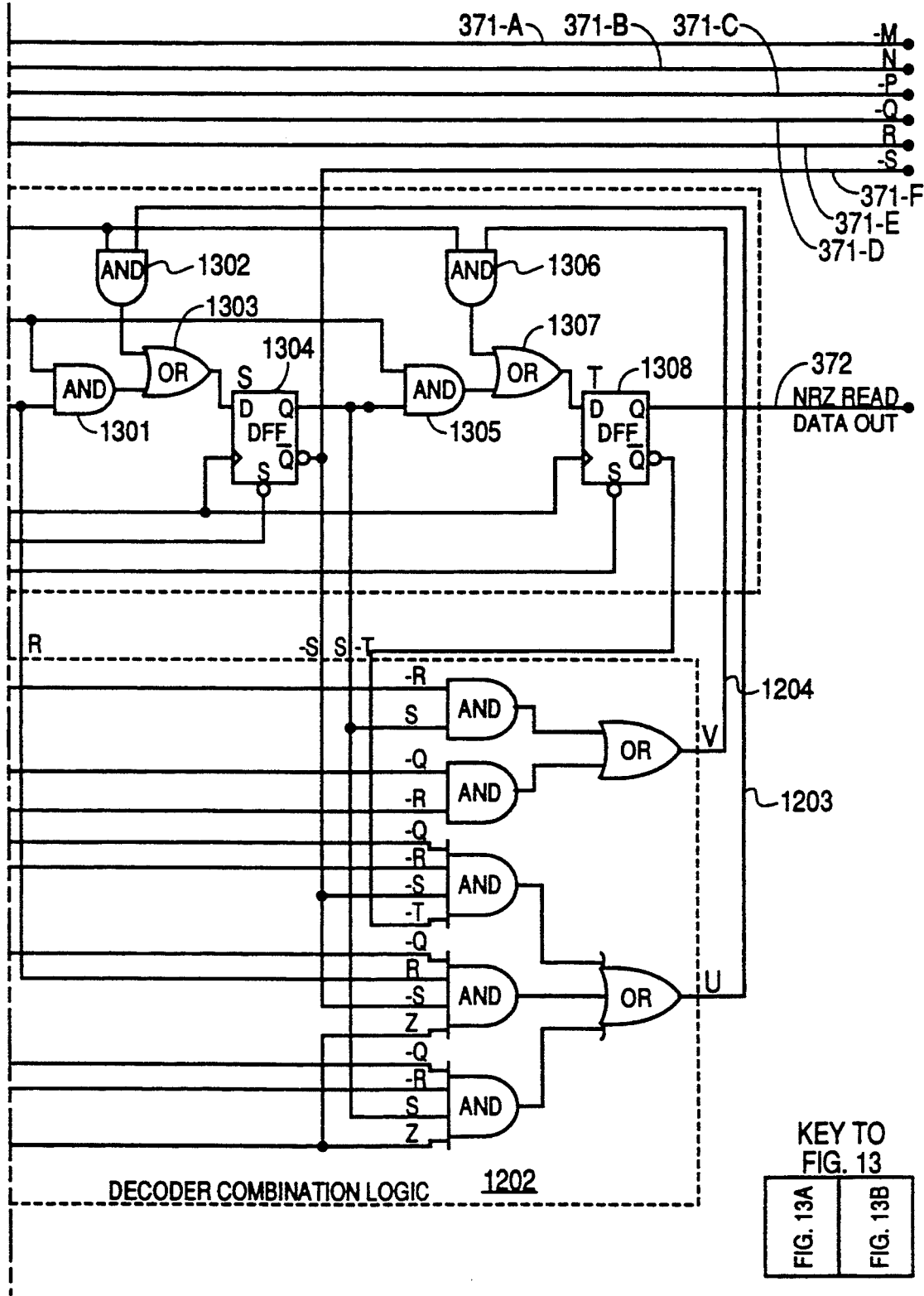

FIG. 13 is a detailed schematic diagram of decoder 370. Seven bit shift register 1201 is contained in dotted box B4 whereas decoder combinatorial logic circuit 1202 is contained in dotted box B5. The asynchronous clear terminal of each of D-type flip-flops M-S of shift register 1201 is connected to preamble detect Q signal 352. The asynchronous clear terminal of each of D-type flip-flop T of shift register 1201 is connected to decoder start signal 351.

In seven bit shift register 1201, sixth stage, stage S, comprises flip-flop 1304. AND gate 1302 and OR gate 1303 form a load path to input terminal D of flip-flop 1304 when decoder load signal 321 is high and decoder shift signal 322 is low. If, on the other hand, decoder load signal 321 is low and decoder shift signal 322 is high, AND gate 1301 and OR gate 1303 form a serial input path to input terminal D of flip-flop 1304. Bit T of shift register 1201 is of similar construction. Output terminal Q of flip-flop 1308 is connected to NRZ read data out line 372.

Decoder combinatorial logic circuit 1202 in dotted box B5 receives the output signals of each of seven bits M-T of seven bit shift register 1201 in dotted box B4. Decoder combinatorial logic circuit 1202 has two output signals, bits U and V, which drive lines 1203 and 1204 respectively. Line 1203 is connected to one input terminal of AND gate 1302 and line 1204 is connected to one input terminal of AND gate 1306.

Figure 14:
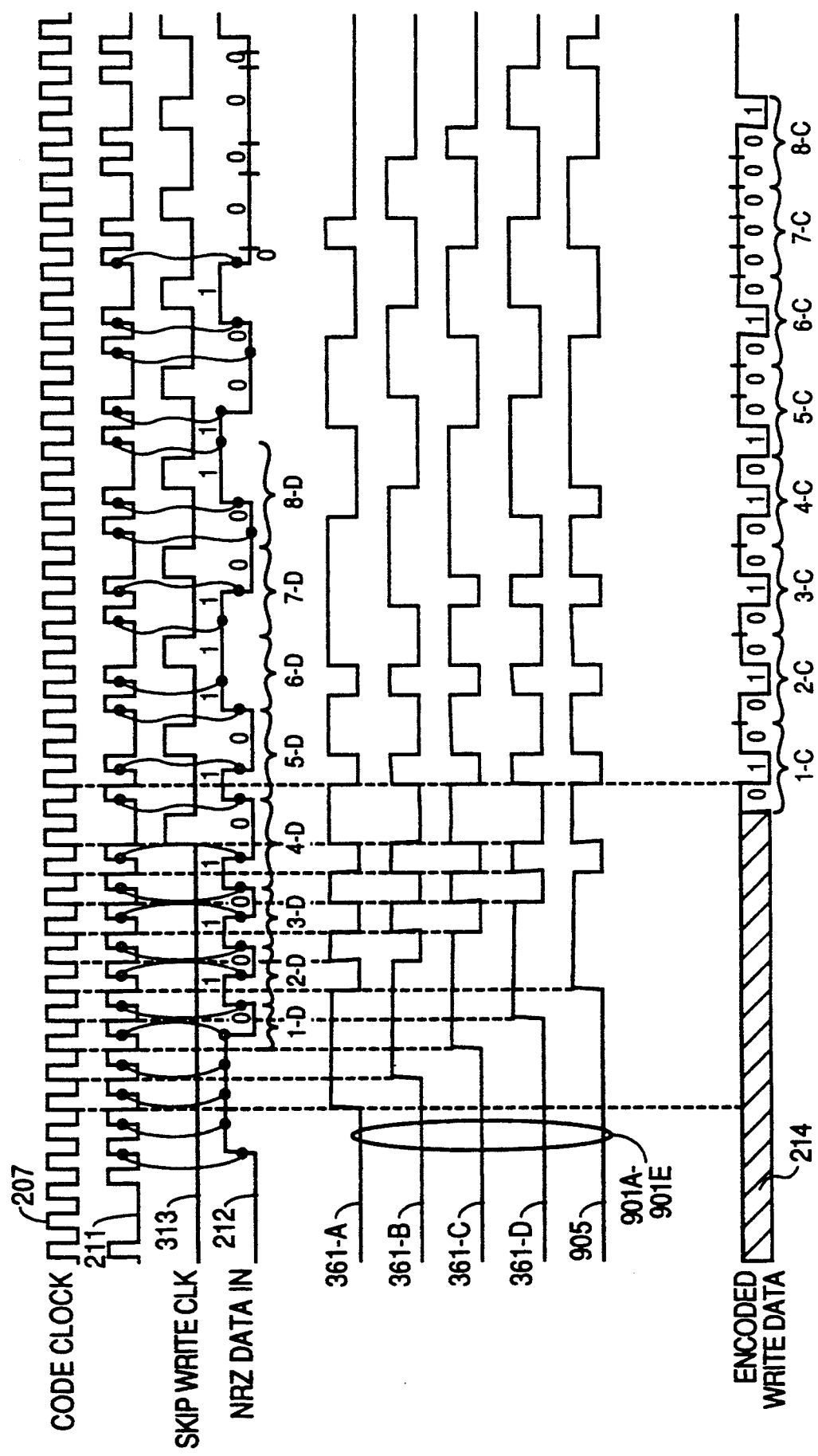
FIG. 14 is a timing diagram for the encoder circuit of this invention.

FIG. 14 is a timing diagram for encoding/decoding system 200 in the initial stage of a write to disk. The first trace at the top of FIG. 14 is write clock signal 215. The second trace from the top of FIG. 14 is the read reference clock signal 211. Initially, code clock signal 207 is driving signal 211, but in the low portion of the signal where reference numeral "211" is located, the clock signal is changed by clock swap lock 301 to write clock signal 215.

The third trace from the top of FIG. 14 is skip write clock signal 313 to read reference clock multiplexer 304. Notice that when skip write clock signal 313 is active, a clock pulse is dropped in read reference clock signal 211. The fourth trace from the top of FIG. 14 is NRZ data 212 from disk controller 201. Thus, this signal trace represents the serial data stream that is an input signal to encoder 360. The various data words in the serial data stream that are created by deserializer 901 are labeled 1-D, 2-D, . . . Hence, the first eight data words are "10 10 10 10 10 11 10 01".

The five signal traces immediately below NRZ data signal 212 represent the output signals of the five bits in deserializer 901. The bottom trace of FIG. 14 is the serial data stream of encoded data 214. The code words are labeled 1-C, 2-C, . . .

Although the invention has been described with the above described embodiments, certain adaptations and modifications may be practiced without departing from the scope of the invention as defined in the appended claims. The above description of the embodiments, therefore, is presented merely for instructional purposes and is not intended to limit the scope of the claimed invention in any way.

I claim:

1. A run length limited encoding/decoding system comprising:

deserializer circuit means operatively coupled to a serial data stream and having a plurality of parallel output terminals and a clock terminal wherein said deserializer circuit means blocks said serial data stream into m bit data words;

encoding logic circuit means connected to said plurality of parallel output terminals of said deserializer means and having a plurality of parallel output terminals wherein said encoding logic circuit means converts an m bit data word into an n bit code word; and an n bit serializer circuit means connected to said plurality of parallel output terminals of said encoding logic circuit means and having a clock terminal and a serial output terminal wherein said serializer circuit means converts said n bit code word to a serial data stream that is supplied to said serial output terminal.

2. The run length limited encoding/decoding system of claim 1 further comprising:

first clock source means, operatively coupled to said serializer circuit means clock terminal, for clocking said n bit code word through said serializer circuit means at a first clock rate wherein said first clock rate comprises a write clock rate.

3. The run length limited encoding/decoding system of claim 2 further comprising:

means, operatively coupled to said first clock source means, for blanking (n-m) clock pulses after every mth clock pulses of said first clock source means so as to generate a second clock rate wherein said second clock rate is used to supply said serial data stream to said deserializer circuit means and said second clock rate comprises a data bit clock rate.

4. The run length limited encoding/decoding system of claim 1 wherein said deserializer circuit means is a shift register having (2m+1) bits.

5. The run length limited encoding/decoding system of claim 4 wherein each bit of said shift register has a hold terminal.

6. The run length limited encoding/decoding system of claim 5 further comprising:

means, operatively coupled to each of said hold terminals and to a clock source having clock pulses with a clock period, for generating a hold signal after every mth clock pulse for a period of (n-m) clock periods.

7. The run length limited encoding/decoding system of claim 4 wherein said serializer circuit means further comprises a serial input terminal wherein the serial output terminal of said serializer circuit means is connected to the serial input terminal of said serializer circuit means so that as said n bit code word is shifted out of said serializer means, said n bit code word is simultaneously recirculated through said serializer circuit means.

8. The run length limited encoding/decoding system of claim 7 wherein said serializer circuit means further comprises a plurality of parallel output terminals wherein said plurality of output terminals are operatively connected to said encoding logic circuit means.

9. The run length limited encoding/decoding system of claim 8 wherein said serializer circuit means is a second shift register having n bits and further wherein said second shift register is different from said first mentioned shift register.

10. The run length limited encoding/decoding system of claim 9 wherein m is 2 so that said first shift register blocks said serial data stream into two bit data words and said plurality of parallel output terminals comprises five terminals A through E.

11. The run length limited encoding/decoding system of claim 10 wherein n is 3 and said plurality of parallel output terminals comprises three terminals F through H.

12. The run length limited encoding/decoding system of claim 11 wherein said encoding logic circuit means performs the operations defined by the following Boolean expressions to generate said three bit code word having bits J, K, and L:

$$FZ = /E * (F + G + H) * D$$
$$L = /FZ * D$$
$$K = (C * /D) + (A * B * /D)$$
$$J = /FZ * /C * (/A + /B)$$

where /=Logic NOT, *=Logic AND, and +=Logic OR.

13. The run length limited encoding/decoding system of claim 1 wherein said deserializer circuit means further comprises a plurality of clear terminals.

14. The run length limited encoding/decoding system of claim 13 further comprising:
means, operatively coupled to each terminal in said plurality of clear terminals, for generating a first signal and a second signal wherein said first signal holds said deserializer circuit means in a clear mode and said second signal releases said clear mode.

15. The run length limited encoding/decoding system of claim 14 wherein said first and second signal generating means further comprises:
means, operatively coupled to said serial data stream, for detecting a predetermined sequence of data bits wherein upon detection of said predetermined sequence, said first and second signal generating means switches from said first signal to said second signal.

16. The run length limited encoding/decoding system of claim 1 further comprising:
deserializer/serializer circuit means operatively coupled to a serial data stream of encoded data, and having a plurality of parallel input terminals, and a serial output terminal wherein said deserializer/serializer circuit means blocks said serial data steam of encoded data into n bit code words and generates a serial data stream of m bit data words on said serial output terminal; and
decoding logic circuit means connected to said plurality of parallel output terminals of said deserializer/serializer circuit means and having a plurality of parallel output terminals operatively connected to said plurality of parallel input terminals of said deserializer/serializer circuit means, wherein said decoding logic circuit means converts an n bit code word into a m bit data word.

17. The run length limited encoding/decoding system of claim 16 wherein said deserializer/serializer circuit means comprises a shift register having (2n+1) bits.

18. The run length limited encoding/decoding system of claim 17 wherein m is 2 and said plurality of output terminals of said decoding logic circuit means includes a first terminal U and a second terminal V.

19. The run length limited encoding/decoding system of claim 18 wherein n is 3 and said plurality of parallel output terminals of said deserializer/serializer circuit means comprises seven terminals M, N, and P through T.

20. The run length limited encoding/decoding system of claim 19 wherein said decoding logic circuit means performs the operations defined by the following Boolean expressions to generate said two bit data word having bits U and V:

$$Z = (P + N + M)$$
$$V = (/R * S) + (/Q * /R)$$
$$U = (Z*S*/R*/Q) + (Z*/S*R*/Q) + (/Q*/R*/S*/T)$$

where /=Logic NOT, *=Logic AND, and +=Logic OR.

21. The run length limited encoding/decoding system of claim 16 wherein said deserializer/serializer circuit means further comprises a plurality of clear terminals.

22. The run length limited encoding/decoding system of claim 21 further comprising:
means, operatively coupled to each terminal in said plurality of clear terminals, for generating a first signal and a second signal wherein said first signal holds said deserializer/serializer circuit means in a clear mode and said second signal releases said clear mode.

23. The run length limited encoding/decoding system of claim 22 wherein said first and second signal generating means further comprises:
means, operatively coupled to said encoded data bits, for detecting a predetermined sequence of encoded data bits wherein upon detection of said predetermined sequence, said first and second signal generating means switches from said first signal to said second signal.

24. In an integrated circuit, a run length limited encoding/decoding system comprising:
clock swap logic means having an input line for receiving a predetermined signal from a disk controller, a first clock enable signal output line and a second clock enable signal output line wherein a first clock enable signal is active on said first clock enable signal output line and upon assertion of said predetermined signal, said first clock enable signal is taken inactive and a second clock enable signal is then taken active on said second clock enable signal output line; and
clock selection circuit means connected to said first and second clock enable signal output lines, a first clock source, a second clock source, and an output line wherein the clock selection circuit means generates a clock signal on said output line based on the signals received from said first and second clock enable signal output lines and said first and second clock sources.

25. A circuit comprising a run length limited encoder portion, said encoder portion comprising:

first input means for receiving data bit information;

first means for shifting, said first means for shifting having a serial input means for receiving data bit information from said first input means;

means for controlling said first means for shifting, said means for controlling causing said first means for shifting to shift during two consecutive pulses of a write clock and not to shift during a third pulse of said write clock following said two consecutive pulses wherein said means for controlling blanks every third pulse of a clock signal;

output means for outputting code bit information according to a run length limited encoding scheme performed on data bit information received by said first input means, said code bit information being serially output by the output means at an output code bit rate; and second input means for receiving a write clock, said write clock clocking at the output code bit rate, all other signals in the encoder portion clocking at rates no faster than said rate of said write clock.

26. The circuit of claim 25, wherein said first means for shifting comprises a five bit shift register.

27. The circuit of claim 25, wherein said output means further comprises:

second means for shifting, said second means for shifting having a serial output means for outputting code bit information; and means for outputting information on three output signal lines J, K and L based at least in part on information on five input signal lines A, B, C, D, and E, said five input signal lines being connected to said first means for shifting, said three output signal lines being connected to said second means for shifting, wherein said first and second means for shifting each have a clock input, said clock inputs of said first and second means for shifting being connected together.

28. The circuit of claim 27, wherein said first means for shifting comprises five stages A, B, C, D and E, each of said five stages of said first means for shifting having a data output which is connected to a respective one of said five input signal lines A, B, C, D and E of said means for outputting information, and wherein said second means for shifting comprises three stages F, G and H, each of said three stages of said second means for shifting having a data input which is connected to a respective one of said three output signal lines J, K and L of said means for outputting information, each of said three stages of said second means for shifting also having a respective data output line F, G and H which is connected to said means for outputting information.

29. The circuit of claim 25, wherein said output means further comprises:

means for shifting, said means for shifting having a serial output means for outputting code bit information, said means for shifting also having a serial input means for receiving serial information, said serial output means of said means for shifting being connected to said serial input means of said means for shifting.

30. The circuit of claim 28 wherein said means for outputting information generates signals on said three output signal lines J, K and L in accordance with the following table:

| A | B | C | D | E | FZ | J | K | L |
|---|---|---|---|---|----|---|---|---|
| X | 0 | 0 | 0 | X | X | 1 | 0 | 0 |
| X | 0 | 0 | 1 | 1 | 0 | 1 | 0 | 1 |
| X | X | 1 | 0 | X | X | 0 | 1 | 0 |
| X | X | 1 | 1 | 1 | 0 | 0 | 0 | 1 |
| 0 | 1 | 0 | 0 | X | X | 1 | 0 | 0 |
| 0 | 1 | 0 | 1 | 1 | 0 | 1 | 0 | 1 |
| 1 | 1 | 0 | 0 | X | X | 0 | 1 | 0 |
| 1 | 1 | 0 | 1 | 1 | 0 | 0 | 0 | 1 |
| X | X | X | 1 | 0 | 1 | 0 | 0 | 0 | wherein X denotes a don't care situation, / denotes logical NOT, * denotes logical AND, denotes logical OR, and wherein value FZ is generated in accordance with the following equation: FZ'/E*(F+G+H).

31. An integrated circuit comprising:

decoder start logic circuit means having a code clock input line, a preamble detect input line, a decoder start output line, and another output line;

read clock skip logic circuit means having an input line connected to said decoder start output lie, a code clock input line, a decoder load output line and a decoder shift output line; and decoder circuit means having a first input line connected to said decoder load output line, a second input line connected to said decoder shift output line, a third input line connected to said decoder start output line, a fourth input line connected to said another output line of said decoder start logic circuit means, a code data input line, a code clock input line and a read data output line.

32. The integrated circuit of claim 31 further comprising:

encoder start logic circuit means having a write clock input line, a write gate input line, an encoder start output line, and another output line;

write clock skip logic circuit means having an input line connected to said encoder start output line, a write clock input line, an encoder load/hold output line and an encoder shift output line; and encoder circuit means having a first input line connected to said encoder load/hold output line, a second input line connected to said encoder shift output line, a third input line connected to said another output line of said encoder start logic circuit means, a data input line, a write clock input line and an encoded write data output line.

33. The integrated circuit of claim 32 wherein said read clock skip logic circuit means further comprises a skip read clock output line; and said write clock skip logic circuit means further comprises a skip write clock output line.

34. The integrated circuit of claim 33 further comprising:

clock swap logic circuit means having a write gate input line, a code clock input line, a write gate input line, an enable write clock output line, and an enable read clock output line; and read reference clock generator circuit having a first input line connected to said enable write clock output line, a second input lined connected to said enable read clock output line, a write clock input line, a read clock input line, a third input line connected to said skip read clock output line, a fourth input line connected to said skip write clock output line, and a read reference clock output line.

* * * * *